(12) United States Patent
Lan et al.

(10) Patent No.: US 11,545,197 B2
(45) Date of Patent: Jan. 3, 2023

(54) ADDRESS LATCH COMPRISING INTERMEDIATE LATCH CIRCUIT THAT LATCHES THE ADDRESS DATA LATCHED BY THE WRITE LATCH CIRCUIT, DISPLAY DEVICE AND ADDRESS LATCHING METHOD

(71) Applicant: Beijing BOE Technology Development Co., Ltd., Beijing (CN)

(72) Inventors: Ronghua Lan, Beijing (CN); Junrui Zhang, Beijing (CN); Xuehui Zhu, Beijing (CN); Zhidong Wang, Beijing (CN); Lijia Zhou, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 288 days.

(21) Appl. No.: 16/831,183

(22) Filed: Mar. 26, 2020

(65) Prior Publication Data
US 2021/0150958 A1 May 20, 2021

(30) Foreign Application Priority Data
Nov. 19, 2019 (CN) .......................... 201911134346.X

(51) Int. Cl.
*G09G 3/36* (2006.01)
*G11C 7/10* (2006.01)
(Continued)

(52) U.S. Cl.
CPC ............. *G11C 7/1096* (2013.01); *G09G 3/20* (2013.01); *G09G 3/3266* (2013.01);
(Continued)

(58) Field of Classification Search
CPC ...... G09G 3/20; G09G 3/3266; G09G 3/3677; G09G 3/3688; G09G 2310/02;
(Continued)

(56) References Cited

U.S. PATENT DOCUMENTS 6,448,976 B1 * 9/2002 Nitta .................... G09G 3/3685
345/98
2002/0167504 A1 * 11/2002 Matsumoto .......... G09G 3/3688
345/204
(Continued)

*Primary Examiner* — Adam J Snyder
(74) *Attorney, Agent, or Firm* — Banner & Witcoff, Ltd.

(57) ABSTRACT

An address latch, a display device, and an address latching method are disclosed. The address latch includes a write control circuit, a write latch circuit, a latch control circuit, an intermediate latch circuit, and an output latch circuit. The write latch circuit is configured to latch an address data in response to N write control signals generated by the write control circuit, N data bits of the address data are divided into (M−1) data bit groups; the latch control circuit is configured to sequentially generate M latch control signals; the intermediate latch circuit is configured to, in response to first to (M−1)-th latch control signals, latch first to (M−1)-th data bit groups latched by the write latch circuit in a time-division manner; and the output latch circuit is configured to output the address data latched by the intermediate latch circuit in response to an M-th latch control signal.

19 Claims, 15 Drawing Sheets

(51) Int. Cl.
  *G09G 3/20* (2006.01)
  *G11C 8/06* (2006.01)
  *G11C 8/10* (2006.01)
  *G09G 3/3266* (2016.01)
  *G11C 19/28* (2006.01)
  *G11C 8/18* (2006.01)

(52) U.S. Cl.
  CPC .......... *G09G 3/3677* (2013.01); *G09G 3/3688* (2013.01); *G11C 7/1087* (2013.01); *G11C 8/06* (2013.01); *G11C 8/10* (2013.01); *G09G 2310/02* (2013.01); *G09G 2310/0286* (2013.01); *G11C 8/18* (2013.01); *G11C 19/28* (2013.01)

(58) Field of Classification Search
  CPC .......... G09G 2310/0286; G11C 7/1087; G11C 7/1096; G11C 8/06; G11C 8/10; G11C 8/18; G11C 19/28
  See application file for complete search history.

(56) References Cited

U.S. PATENT DOCUMENTS

| | | | | |
|---|---|---|---|---|
| 2004/0174347 A1* | 9/2004 | Sun | ...... | G09G 3/3685 345/204 |
| 2004/0227717 A1* | 11/2004 | Yeh | ...... | G09G 3/3648 345/100 |
| 2006/0139286 A1* | 6/2006 | Kida | ...... | G09G 3/3688 345/98 |
| 2007/0109169 A1* | 5/2007 | Lin | ...... | G09G 3/3688 341/155 |
| 2007/0152947 A1* | 7/2007 | Tanaka | ...... | G09G 3/3688 345/100 |
| 2007/0216631 A1* | 9/2007 | Nojiri | ...... | G09G 3/3688 345/100 |
| 2010/0225625 A1* | 9/2010 | Morita | ...... | G09G 3/3688 345/205 |

* cited by examiner

ADDRESS LATCH COMPRISING INTERMEDIATE LATCH CIRCUIT THAT LATCHES THE ADDRESS DATA LATCHED BY THE WRITE LATCH CIRCUIT, DISPLAY DEVICE AND ADDRESS LATCHING METHOD

CROSS-REFERENCE TO RELATED APPLICATION

The application claims priority to Chinese patent application No. 201911134346.X, filed on Nov. 19, 2019. For all purposes under the U.S. law, the entire disclosure of the aforementioned application is incorporated by reference as part of the disclosure of this application.

TECHNICAL FIELD

Embodiments of the present disclosure relate to an address latch, a display device, and an address latching method.

BACKGROUND

When designing an address latch, in order to ensure the accuracy of the address transmission, usually, the delay time of a signal should be strictly controlled to prevent the address transmission from misplacement. However, in an existing address latch, it is often difficult to control the delay of the signal within one clock cycle due to factors such as long wiring, which will eventually cause the address signal to be transmitted incorrectly.

SUMMARY

At least one embodiment of the present disclosure provides an address latch comprising: a write control circuit, a write latch circuit, a latch control circuit, an intermediate latch circuit, and an output latch circuit, wherein the write control circuit is configured to generate N write control signals, and N is a positive integer greater than or equal to 2; the write latch circuit is connected to the write control circuit, and is configured to latch an address data that is received in response to the N write control signals, the address data comprises N data bits, and the N data bits are divided into (M−1) data bit groups; the latch control circuit is configured to sequentially generate M latch control signals, and M is a positive integer greater than or equal to 3; the intermediate latch circuit is connected to the write latch circuit and the latch control circuit, and is configured to sequentially latch, in response to first to (M−1)-th latch control signals of the M latch control signals, the (M−1) data bit groups of the address data latched by the write latch circuit in a time-division manner; and the output latch circuit is connected to the intermediate latch circuit and the latch control circuit, and is configured to output the address data latched by the intermediate latch circuit from the address latch in response to an M-th latch control signal of the M latch control signals.

For example, in the address latch provided by an embodiment of the present disclosure, the write latch circuit comprises N write latch sub-circuits, the N write latch sub-circuits are configured to be sequentially turned on, in response to the N write control signals, respectively, to latch respective data bits of the address data, respectively.

For example, in the address latch provided by the embodiment of the present disclosure, each of the N write latch sub-circuits comprises a control terminal, an input terminal, and an output terminal, the control terminal of each write latch sub-circuit is configured to receive a corresponding write control signal of the N write control signals; and the input terminal of each write latch sub-circuit is connected to an address data line to receive the address data.

For example, in the address latch provided by the embodiment of the present disclosure, the write control circuit comprises N write control sub-circuits, and the N write control sub-circuits are connected to the N write latch sub-circuits in one-to-one correspondence manner, the N write control sub-circuits are configured to respectively generate the N write control signals in one-to-one correspondence manner.

For example, in the address latch provided by the embodiment of the present disclosure, each of the N write control sub-circuits comprises a control terminal, an input terminal, and an output terminal, the control terminal of each write control sub-circuit is connected to a write clock signal line to receive a write clock signal, the output terminals of the N write control sub-circuits are connected to the control terminals of the N write latch circuits in one-to-one correspondence manner, an input terminal of a first write control sub-circuit of the N write control sub-circuits is connected to an output terminal of an N-th write control sub-circuit of the N write control sub-circuits, and an output terminal of an j-th write control sub-circuit of the N write control sub-circuits is connected to an input terminal of an (j+1)-th write control sub-circuit of the N write control sub-circuits, 1≤j≤N−1, and j is a positive integer.

For example, in the address latch provided by the embodiment of the present disclosure, the intermediate latch circuit comprises N intermediate latch sub-circuits, the N intermediate latch sub-circuits are connected to the N write latch sub-circuits in one-to-one correspondence manner, and the N intermediate latch sub-circuits are divided into (M−1) intermediate latch sub-circuit groups, the (M−1) intermediate latch sub-circuit groups latch the (M−1) data bit groups of the address data latched by the write latch circuit at first to (M−1)-th moments, respectively, in response to the first to (M−1)-th latch control signals, respectively.

For example, in the address latch provided by the embodiment of the present disclosure, each of the (M−1) intermediate latch sub-circuit groups comprises a plurality of intermediate latch sub-circuits, and the plurality of intermediate latch sub-circuits are adjacent to each other or not adjacent to each other.

For example, in the address latch provided by the embodiment of the present disclosure, each of the N intermediate latch sub-circuits comprises a control terminal, an input terminal, and an output terminal, the input terminals of the N intermediate latch sub-circuits are connected to the output terminals of the N write latch sub-circuits in one-to-one correspondence manner, and the control terminals of each of the (M−1) intermediate latch sub-circuit groups are configured to receive a corresponding latch control signal of the first to (M−1)-th latch control signals.

For example, in the address latch provided by the embodiment of the present disclosure, the output latch circuit comprises N output latch sub-circuits, the N output latch sub-circuits are connected to the N intermediate latch sub-circuits in one-to-one correspondence manner, the N output latch sub-circuits are configured to output the address data latched by the intermediate latch sub-circuit from the address latch at an M-th moment in response to the M-th latch control signal.

For example, in the address latch provided by the embodiment of the present disclosure, each of the N output latch sub-circuits comprises a control terminal, an input terminal, and an output terminal, the input terminals of the N output latch sub-circuits are connected to the output terminals of the N intermediate latch sub-circuits in one-to-one correspondence manner; and the control terminal of each output latch sub-circuit is configured to receive the M-th latch control signal.

For example, in the address latch provided by the embodiment of the present disclosure, each of the N write control sub-circuits is a D flip-flop, each of the N write latch sub-circuits is a D latch, each of the N intermediate latch sub-circuits is a D latch, and each of the N output latch sub-circuits is a D latch.

For example, in the address latch provided by the embodiment of the present disclosure, the latch control circuit comprises a primary latch control circuit and a secondary latch control circuit, the primary latch control circuit is configured to generate L primary latch control signals in response to a latch enable signal, a first control signal, and a second control signal, the secondary latch control circuit is configured to generate L secondary latch control signals in response to the first control signal, the second control signal, and the L primary latch control signals, and M secondary latch control signals of the L secondary latch control signals are used as the M latch control signals, and L is a positive integer greater than or equal to M.

For example, in the address latch provided by the embodiment of the present disclosure, the primary latch control circuit comprises L primary latch control sub-circuits, and each of the L primary latch control sub-circuits comprises a control terminal, an input terminal, and an output terminal, a control terminal of a (2l−1)-th primary latch control sub-circuit of the L primary latch control sub-circuits is connected to a first control signal line to receive the first control signal, and a control terminal of a 2l-th primary latch control sub-circuit of the L primary latch control sub-circuits is connected to a second control signal line to receive the second control signal, an input terminal of a first primary latch control sub-circuit of the L primary latch control sub-circuits is connected to an enable signal line to receive the latch enable signal, an output terminal of a p-th primary latch control sub-circuit of the L primary latch control sub-circuits is connected to an input terminal of a (p+1)-th primary latch control sub-circuit of the L primary latch control sub-circuits, and output terminals of the L primary latch control sub-circuits output the L primary latch control signals, respectively, $1 \leq l \leq L/2$, l is a positive integer, $1 \leq p \leq L-1$, p is a positive integer; the secondary latch control circuit comprises L secondary latch control sub-circuits, and each of the L secondary latch control sub-circuits comprises a control terminal, an input terminal, and an output terminal, an input terminal of a (2l−1)-th secondary latch control sub-circuit of the L secondary latch control sub-circuits is connected to the second control signal line to receive the second control signal, an input terminal of a 2l-th secondary latch control sub-circuit of the L secondary latch control sub-circuits is connected to the first control signal line to receive the first control signal, the control terminals of the L secondary latch control sub-circuits are connected to the output terminals of the L primary latch control sub-circuits in one-to-one correspondence manner, and the output terminals of the L secondary latch control sub-circuits output the L secondary latch control signals, respectively.

For example, in the address latch provided by the embodiment of the present disclosure, each of the L primary latch control sub-circuits is a D latch.

For example, in the address latch provided by the embodiment of the present disclosure, each of the L secondary latch control sub-circuits comprises an NOT gate, a transmission gate, and a transistor, a first terminal of the NOT gate is connected to a first control terminal of the transmission gate, the first terminal of the NOT gate is a control terminal of a corresponding secondary latch control sub-circuit, a second terminal of the NOT gate is connected to a second control terminal of the transmission gate and a gate electrode of the transistor, an input terminal of the transmission gate is an input terminal of the corresponding secondary latch control sub-circuit, an output terminal of the transmission gate is connected to a first electrode of the transistor, the output terminal of the transmission gate is an output terminal of the corresponding secondary latch control sub-circuit, and a second electrode of the transistor is grounded.

For example, the address latch provided by the embodiment of the present disclosure further comprises an address decoding circuit, wherein the address decoding circuit is configured to decode the address data output from the output latch circuit.

At least one embodiment of the present disclosure further provides a display device comprising a gate driver and the address latch provided by any of the foregoing embodiments, wherein the gate driver is configured to generate a scan signal corresponding to the address data in response to the address data output from the address latch.

At least one embodiment of the present disclosure further provides an address latching method adopting the address latch provided by any one of the foregoing embodiments, the address latching method comprise: in a write latch phase, latching, by the write latch circuit, the address data in response to the N write control signals generated by the write control circuit; in an intermediate latch phase, latching, by the intermediate latch circuit, the (M−1) data bit groups of the address data latched by the write latch circuit in a time-division manner in response to the first to (M−1)-th latch control signals generated by the latch control circuit; in an output latch phase, outputting, by the output latch circuit, the address data latched by the intermediate latch circuit from the address latch in response to the M-th latch control signal generated by the latch control circuit.

For example, in the address latching method provided by the embodiment of the present disclosure, before the write latch circuit has latched all data bits of the address data, the intermediate latch circuit starts to latch a part of data bits, which has been latched by the write latch circuit, of the address data.

For example, the address latching method provided by the embodiment of the present disclosure further comprises: in an address decoding phase, decoding, by the address decoding circuit, the address data output from the output latch circuit.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present invention belongs. The terms "first," "second," etc., which are used in the description and the claims of the present disclosure for invention, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1A:
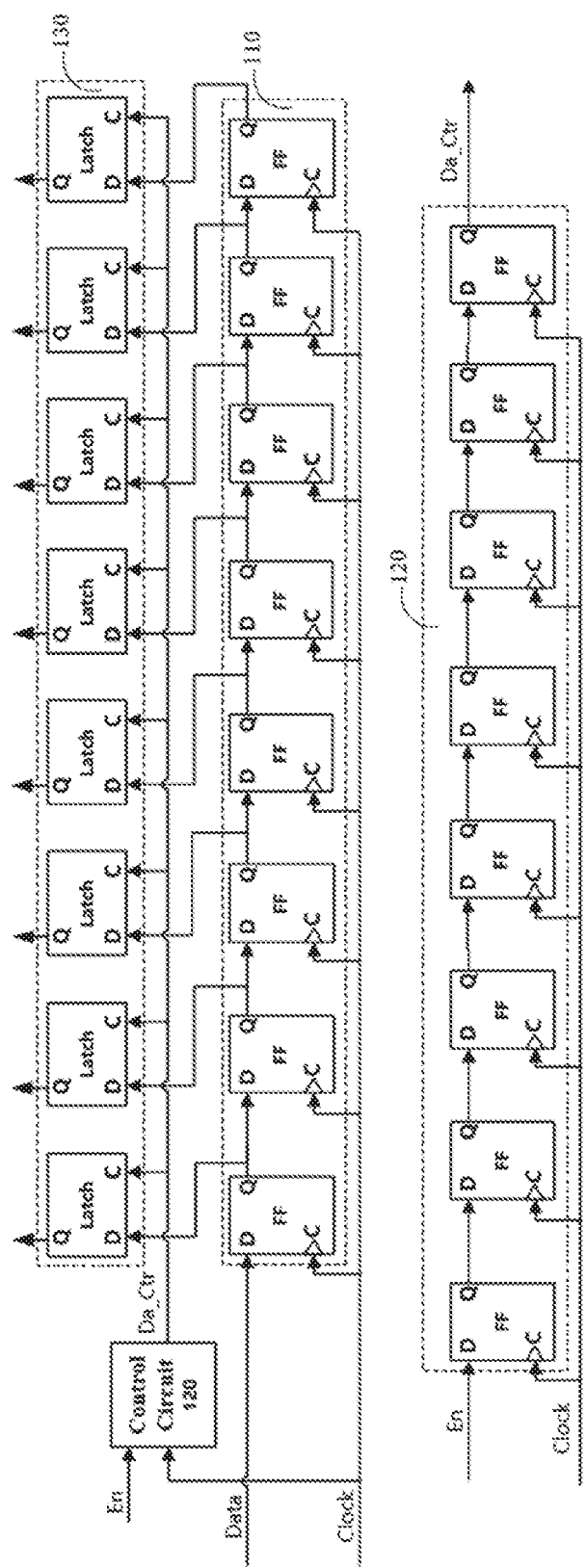
FIG. 1A is a structural diagram of an address latch.
Figure 1B:
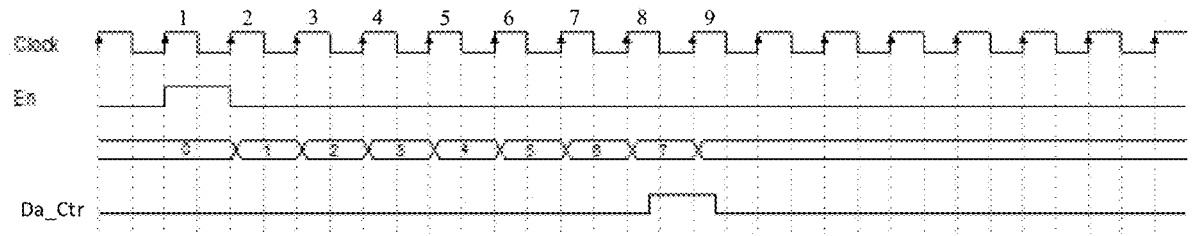
FIG. 1B is a signal timing diagram of the address latch in FIG. 1A.

FIG. 1A is a structural diagram of an address latch. FIG. 1B is a signal timing diagram of the address latch in FIG. 1A.

As illustrated in FIG. 1A, the address latch includes a write circuit 110, a control circuit 120, and an output circuit 130. The write circuit 110 is configured to temporarily store address data Data in response to a clock signal Clock; the control circuit 120 is configured to generate a control signal Da_Ctr in response to an enable signal En and the clock signal Clock; and the output circuit 130 is configured to output the address data Data temporarily stored in the write circuit 110 from the address latch in response to the control signal Da_Ctr generated by the control circuit 120.

As illustrated in FIG. 1A, the write circuit 110 includes a shift register composed of eight D flip-flops, the control circuit 120 includes a counter composed of eight D flip-flops, and the output circuit 130 includes a register composed of eight D latches.

As illustrated in FIG. 1A and FIG. 1B, the eight D flip-flops of the write circuit 110 sequentially shift eight data bits included in the received address data Data to the right eight times in response to eight rising edges, generated in sequence, of the clock signal Clock, thereby temporarily storing the eight data bits of the address data Data in the eight D flip-flops of the write circuit 110.

As illustrated in FIG. 1A and FIG. 1B, when the write circuit 110 starts receiving the address data Data, the control circuit 120 is activated in response to the enable signal En and the clock signal Clock, and generates a control signal Da_Ctr when the eighth rising edge of the clock signal Clock arrives (i.e., after counting eight times).

As illustrated in FIG. 1A and FIG. 1B, the eight D latches in the output circuit 130 output the eight data bits of the address data Data temporarily stored in the eight D flip-flops of the write circuit 110 from the address latch in response to the control signal Da_Ctr generated by the control circuit 120.

In the address latch illustrated in FIG. 1A, because the data bit of the address data Data stored in each D flip-flop of the write circuit 110 changes within each clock cycle, the delay of the control signal Da_Ctr generated by the control circuit 120 must be less than one clock cycle, that is, the control signal Da_Ctr must be transmitted from the control circuit 120 to the output circuit 130 after the eighth rising edge of the clock signal Clock arrives and before the ninth rising edge of the clock signal Clock arrives, otherwise the address data Data output by the output circuit 130 will be misaligned. However, when the wiring between the control circuit 120 and the output circuit 130 is long, it is difficult to limit the delay of the control signal Da_Ctr to one clock cycle, so the accuracy of the address transmission of the address latch illustrated in FIG. 1A cannot be guaranteed.

In order to keep the following description of the embodiments of the present disclosure clear and concise, the present disclosure omits detailed descriptions of some known functions and components.

At least one embodiment of the present disclosure provides an address latch, and the address latch includes a write control circuit, a write latch circuit, a latch control circuit, an intermediate latch circuit, and an output latch circuit. The write control circuit is configured to generate N write control signals, and N is a positive integer greater than or equal to 2; the write latch circuit is connected to the write control circuit, and is configured to latch an address data that is received in response to the N write control signals, the address data includes N data bits, and the N data bits are divided into (M−1) data bit groups; the latch control circuit is configured to sequentially generate M latch control signals, and M is a positive integer greater than or equal to 3; the intermediate latch circuit is connected to the write latch circuit and the latch control circuit, and is configured to latch, in response to first to (M−1)-th latch control signals of the M latch control signals, first to M−1th data bit groups of the address data latched by the write latch circuit in a time-division manner; the output latch circuit is connected to the intermediate latch circuit and the latch control circuit, and is configured to output the address data latched by the intermediate latch circuit from the address latch in response to an M-th latch control signal of the M latch control signals.

In the address latch provided by the embodiments of the present disclosure, the address data latched by the write latch circuit is not directly output from the address latch through the output latch circuit, but the address data latched by the write latch circuit is first latched by the intermediate latch circuit in a time-division manner, and then the address data latched by the intermediate latch circuit is output from the address latch through the output latch circuit. The address latch provided by the embodiments of the present disclosure can ensure that even if the latch control signal generated by the latch control circuit is delayed by several clock cycles, the address data finally output by the output latch circuit will not be misaligned, which can ensure the stability and accuracy of address transmission when the internal delay of the circuit is high, increases the timing redundancy in the process of address transmission, and ensure that the corresponding row address can still be turned on correctly at high frequencies.

It should be noted that, in the present disclosure, "signal" refers to a signal at an operating level (e.g., a high level).

The embodiments of the present disclosure are described in detail below with reference to the accompany drawings, but the present disclosure is not limited to these specific embodiments.

Figure 2A:
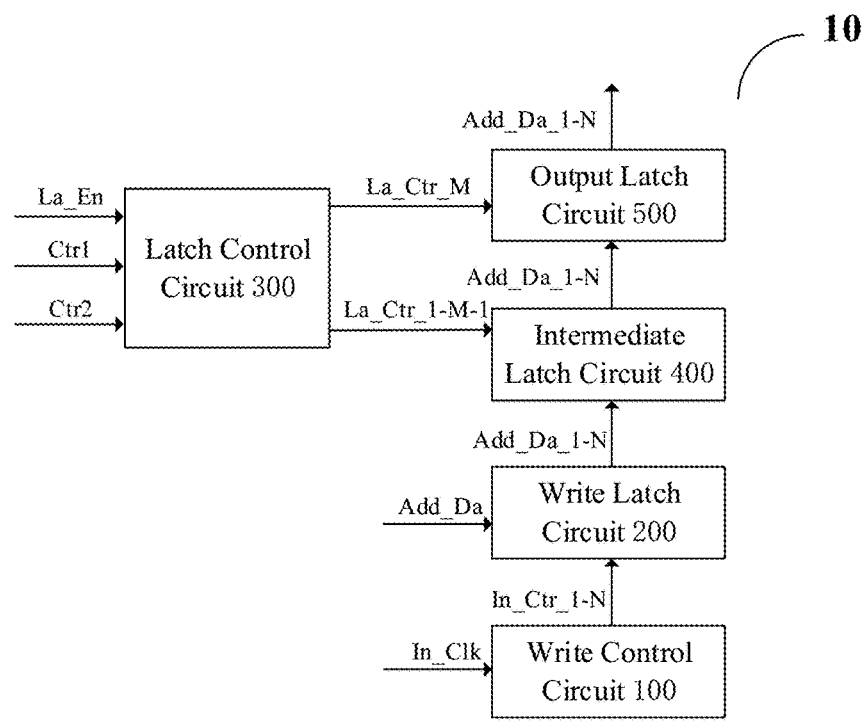
FIG. 2A is a block diagram of an address latch according to an embodiment of the present disclosure.

FIG. 2A is a block diagram of an address latch according to an embodiment of the present disclosure.

As illustrated in FIG. 2A, the address latch 10 includes a write control circuit 100, a write latch circuit 200, a latch control circuit 300, an intermediate latch circuit 400, and an output latch circuit 500.

As illustrated in FIG. 2A, the write control circuit 100 is configured to generate N write control signals In_Ctr_1-N based on a write clock signal In_CLK, and N is a positive integer greater than or equal to 2.

As illustrated in FIG. 2A, the write latch circuit 200 is connected to the write control circuit 100, and is configured to latch the address data Add_Da that is received in response to the N write control signals In_Ctr_1-N generated by the write control circuit 100, the address data Add_Da can include N data bits Add_Da_1-N, the N data bits Add_Da_1-N of the address data Add_Da can be divided into (M−1) data bit groups, and the (M−1) data bit groups are a first data bit group, a second data bit group, . . . , a (M−1)-th data bit group, respectively. For example, in some embodiments, the address data Add_Da may include eight (i.e., N=8) data bits, and the eight data bits may be a first data bit Add_Da_1, a second data bit Add_Da_2, a third data bit Add_Da_3, a fourth data bit Add_Da_4, a fifth data bit Add_Da_5, a sixth data bit Add_Da_6, a seventh data bit Add_Da_7, and an eighth data bit Add_Da_8.

As illustrated in FIG. 2A, the latch control circuit 300 is configured to generate M latch control signals La_Ctr_1-M based on a latch enable signal La_En, a first control signal Ctr1, and a second control signal Ctr2, and M is a positive integer greater than or equal to 3.

As illustrated in FIG. 2A, the intermediate latch circuit 400 is connected to the write latch circuit 200 and the latch control circuit 300, and is configured to latch, in response to the first to (M−1)-th latch control signals La_Ctr_1-M−1 of the M latch control signals La_Ctr_1-M generated by the latch control circuit 300, the (M−1) data bit groups of the address data Add_Da latched by the write latch circuit 200 in a time-division manner.

As illustrated in FIG. 2A, the output latch circuit 500 is connected to the intermediate latch circuit 400 and the latch control circuit 300, and is configured to output the address data Add_Da latched by the intermediate latch circuit 400 from the address latch 10 in response to the M-th latch control signal La_Ctr_M of the M latch control signals generated by the latch control circuit 300.

For example, the address latch provided by the embodiment of the present disclosure may further include an address decoding circuit configured to decode the address data output by the output latch circuit.

Figure 2B:
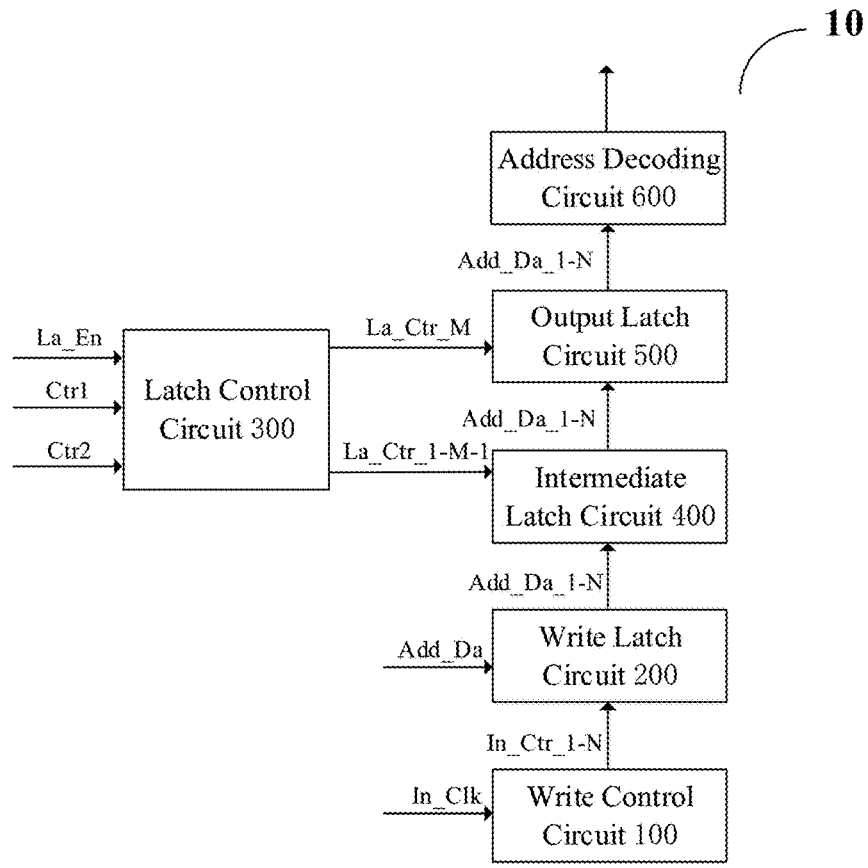
FIG. 2B is a block diagram of another address latch according to an embodiment of the present disclosure.

FIG. 2B is a block diagram of another address latch according to an embodiment of the present disclosure.

As illustrated in FIG. 2B, the address latch 10 may further include an address decoding circuit 600. The address decoding circuit 600 is connected to the output latch circuit 500, and is configured to decode the address data Add_Da output by the output latch circuit 500.

It should be noted that the address decoding circuit 600 may adopt components that can implement a decoding function, such as an existing address decoder, which is not limited in the present disclosure. For the connection relationship and functions of the other components in the address latch illustrated in FIG. 2B, reference may be made to the corresponding components in the address latch illustrated in FIG. 2A, and details are not described herein again.

For example, in the address latch provided by an embodiment of the present disclosure, the write control circuit includes N write control sub-circuits, and the N write control sub-circuits are configured to generate the N write control signals, respectively. Each write control sub-circuit includes a control terminal, an input terminal, and an output terminal. The control terminal of each write control sub-circuit is connected to a write clock signal line to receive the write clock signal; the output terminal of each write control sub-circuit outputs a write control signal; the input terminal of the first write control sub-circuit is connected to the output terminal of the N-th write control sub-circuit, and the output terminal of the j-th write control sub-circuit is connected to the input terminal of the (j+1)-th write control sub-circuit, 1≤j≤N−1, and j is a positive integer, that is, except for the last write control sub-circuit, the output terminal of each of the other write control sub-circuits is connected to the input terminal of a next write control sub-circuit.

Figure 3:
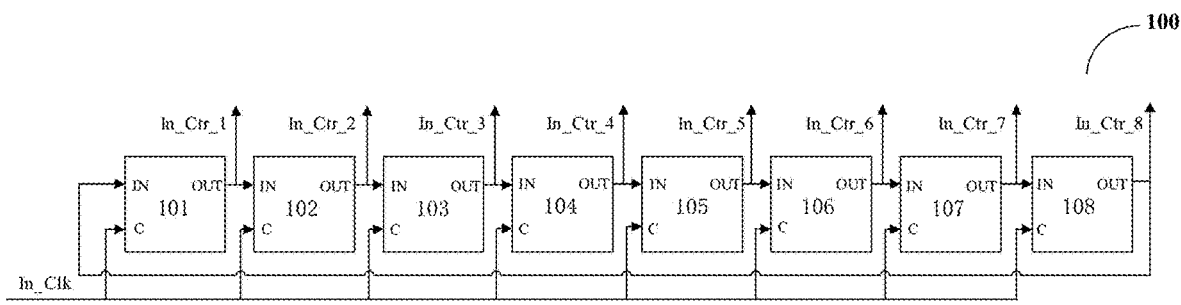
FIG. 3 is a schematic diagram of a write control circuit in the address latch illustrated in FIGS. 2A and 2B.

FIG. 3 is a schematic diagram of the write control circuit in the address latch illustrated in FIGS. 2A and 2B. FIG. 3 illustrates a case where the write control circuit 100 includes eight (i.e., N=8) write control sub-circuits. In this case, the write control circuit 100 is configured to generate eight write control signals, the eight write control signals are a first write control signal In_Ctr_1, a second write control signal In_Ctr_2, a third write control signal In_Ctr_3, a fourth write control signal In_Ctr_4, a fifth write control signal In_Ctr_6, a seventh write control signal In_Ctr_7, and an eighth write control signal In_Ctr_8, respectively.

As illustrated in FIG. 3, the write control circuit 100 includes a first write control sub-circuit 101, a second write control sub-circuit 102, a third write control sub-circuit 103, a fourth write control sub-circuit 104, and a fifth write control sub-circuit 105, a sixth write control sub-circuit 106, a seventh write control sub-circuit 107, and a eighth write control sub-circuit 108.

As illustrated in FIG. 3, each write control sub-circuit in the write control circuit 100 includes a control terminal C, an input terminal IN, and an output terminal OUT.

As illustrated in FIG. 3, the control terminals C of the first write control sub-circuit 101, the second write control sub-circuit 102, the third write control sub-circuit 103, the fourth write control sub-circuit 104, the fifth write control sub-circuit 105, the sixth write control sub-circuit 106, the seventh write control sub-circuit 107, and the eighth write control sub-circuit 108 are all connected to the write clock signal line to receive the write clock signal In_Clk.

As illustrated in FIG. 3, the output terminal OUT of the first write control sub-circuit 101 is connected to the input terminal IN of the second write control sub-circuit 102, the output terminal OUT of the second write control sub-circuit 102 is connected to the input terminal IN of the third write control sub-circuit 103, the output terminal OUT of the third write control sub-circuit 103 is connected to the input terminal IN of the fourth write control sub-circuit 104, the output terminal OUT of the fourth write control sub-circuit 103 is connected to the input terminal IN of the fifth write control sub-circuit 105, the output terminal OUT of the fifth write control sub-circuit 105 is connected to the input terminal IN of the sixth write control sub-circuit 106, the output terminal OUT of the sixth write control sub-circuit 106 is connected to the input terminal IN of the seventh write control sub-circuit 107, the output terminal OUT of the seventh write control sub-circuit 107 is connected to the input terminal IN of the eighth write control sub-circuit 108, and the output terminal OUT of the eighth write control sub-circuit 108 is connected to the input terminal IN of the first write control sub-circuit 101.

As illustrated in FIG. 3, the first write control sub-circuit 101 is configured to generate the first write control signal In_Ctr_1 based on the write clock signal In_Clk and the eighth write control signal In_Ctr_8, the second write control sub-circuit 102 is configured to generate the second write control signal In_Ctr_2 based on the write clock signal In_Clk and the first write control signal In_Ctr_1, the third write control sub-circuit 103 is configured to generate the third write control signal In_Ctr_3 based on the write clock signal In_Clk and the second write control signal In_Ctr_2, the fourth write control sub-circuit 104 is configured to generate the fourth write control signal In_Ctr_4 based on the write clock signal In_Clk and the third write control signal In_Ctr_3, the fifth write control sub-circuit 105 is configured to generate the fifth write control signal In_Ctr_5 based on the write clock signal In_Clk and the fourth write control signal In_Ctr_4, the sixth write control sub-circuit 106 is configured to generate the sixth write control signal In_Ctr_6 based on the write clock signal In_Clk and the fifth write control signal In_Ctr_5, the seventh write control sub-circuit 107 is configured to generate the seventh write control signal In_Ctr_7 based on the write clock signal In_Clk and the sixth write control signal In_Ctr_6, and the eighth sub-write control circuit 108 is configured to generate the eighth write control signal In_Ctr_8 based on the write clock signal In_Clk and the seventh write control signal In_Ctr_7.

As illustrated in FIG. 3, the output terminal OUT of the first write control sub-circuit 101 outputs the first write control signal In_Ctr_1, the output terminal OUT of the second write control sub-circuit 102 outputs the second write control signal In_Ctr_2, the output terminal OUT of the third write control sub-circuit 103 outputs the third write control signal In_Ctr_3, the output terminal OUT of the fourth write control sub-circuit 104 outputs the fourth write control signal In_Ctr_4, the output terminal OUT of the fifth write control sub-circuit 105 outputs the fifth write control signal In_Ctr_5, the output terminal OUT of the sixth write control sub-circuit 106 outputs the sixth write control signal In_Ctr_6, the output terminal OUT of the seventh write control sub-circuit 107 outputs the seventh write control signal In_Ctr_7, and the output terminal OUT of the eighth write control sub-circuit 108 outputs the eighth write control signal In_Ctr_8.

It should be noted that although the case where the write control circuit includes eight (i.e., N=8) write control sub-circuits is illustrated in FIG. 3, the embodiments of the present disclosure are obviously not limited thereto. The number of write control sub-circuits included in the write control circuit can be set according to the number of data bits included in the address data that needs to be latched, for example, the number of write control sub-circuits included in the write control circuit can be equal to the number of data bits included in the address data. For example, if the address data to be latched includes 6 data bits, the write control circuit may include 6 write control sub-circuits to generate 6 write control signals to control the latching of the 6 data bits of the address data, or if the address data to be latched includes 10 data bits, the write control circuit may include 10 write control sub-circuits to generate 10 write control signals to control the latching of the 10 data bits of the address data. In addition, it can be understood that in a case where the address data to be latched includes 6 data bits, the write control circuit may also include 8 write control sub-circuits to generate 8 write control signals. In this case, 6 write control signals can be selected from the 8 write control signals to control the latching of the 6 data bits of the address data, and the two remaining write control signals of the 8 write control signals may not be used to control the latching of the address data.

For example, in the address latch provided by the embodiment of the present disclosure, the write latch circuit includes N write latch sub-circuits, the N write latch sub-circuits are connected to the N write control sub-circuits in one-to-one correspondence manner, and the N write latch sub-circuits are configured to be sequentially turned on, in response to the N write control signals, respectively, to latch respective data bits of the address data, respectively. Each write latch sub-circuit includes a control terminal, an input terminal, and an output terminal. The control terminals of the N write latch sub-circuits are connected to the output terminals of the N write control sub-circuits in one-to-one correspondence manner, so that each write latch sub-circuit receives the write control signal generated by the corresponding write control sub-circuit. The input terminal of each write latch sub-circuit is connected to an address data line to receive the address data. The output terminals of the N write latch sub-circuits are connected to the intermediate latch circuit 400.

Figure 4:
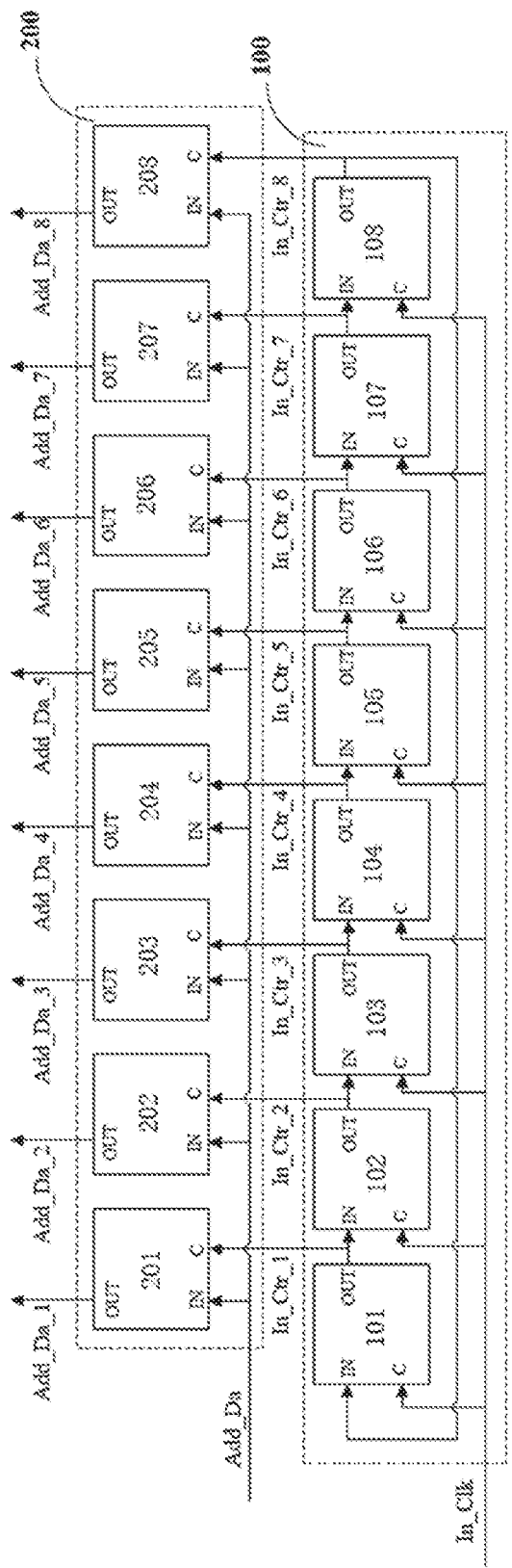
FIG. 4 is a schematic diagram of a write latch circuit in the address latch illustrated in FIGS. 2A and 2B.

FIG. 4 is a schematic diagram of the write latch circuit in the address latch illustrated in FIGS. 2A and 2B. FIG. 4 illustrates a case where the write latch circuit 200 includes eight (i.e., N=8) write latch sub-circuits.

As illustrated in FIG. 4, the write latch circuit 200 includes a first write latch sub-circuit 201, a second write latch sub-circuit 202, a third write latch sub-circuit 203, a fourth write latch sub-circuit 204, a fifth write latch sub-circuit 205, a sixth write latch sub-circuit 206, a seventh write latch sub-circuit 207, and an eighth write latch sub-circuit 208.

As illustrated in FIG. 4, each write latch sub-circuit in the write latch circuits 200 includes a control terminal C, an input terminal IN, and an output terminal OUT.

As illustrated in FIG. 4, the control terminal C of the first write latch sub-circuit 201 is connected to the output terminal OUT of the first write control sub-circuit 101 to receive the first write control signal In_Ctr_1, the control terminal C of the second write latch sub-circuit 202 is connected to the output terminal OUT of the second write control sub-circuit 102 to receive the second write control signal In_Ctr_2, the control terminal C of the third write latch sub-circuit 203 is connected to the output terminal OUT of the third write control sub-circuit 103 to receive the third write control signal In_Ctr_3, the control terminal C of the fourth write latch sub-circuit 204 is connected to the output terminal OUT of the fourth write control sub-circuit 104 to receive the fourth write control signal In_Ctr_4, the control terminal C of the fifth write latch sub-circuit 205 is connected to the output terminal OUT of the fifth write control sub-circuit 105 to receive the fifth write control signal In_Ctr_5, the control terminal C of the sixth write latch sub-circuit 206 is connected to the output terminal OUT of the sixth write control sub-circuit 106 to receive the sixth write control signal In_Ctr_6, the control terminal C of the seventh write latch sub-circuit 207 is connected to the output terminal OUT of the seventh write control sub-circuit 107 to receive the seventh write control signal In_Ctr_7, and the control terminal C of the eighth write latch sub-circuit 208 is connected to the output terminal OUT of the eighth write control sub-circuit 108 to receive the eighth write control signal In_Ctr_8.

As illustrated in FIG. 4, the input terminals IN of the first write latch sub-circuit 201, the second write latch sub-circuit 202, the third write latch sub-circuit 203, the fourth write latch sub-circuit 204, the fifth write the latch sub-circuit 205, the sixth write latch sub-circuit 206, the seventh write latch sub-circuit 207, and the eighth write latch sub-circuit 208 are all connected to the address data line to receive the address data Add_Da.

For example, in the address latch provided by the embodiment of the present disclosure, the N write control signals generated by the N write control sub-circuits are in one-to-one correspondence with the N write latch sub-circuits, therefore, at any time, only one of the N write latch sub-circuits in the write latch circuit is turned on in response to a corresponding write control signal.

As illustrated in FIG. 4, the first write latch sub-circuit 201 is configured to be turned on in response to the first write control signal In_Ctr_1 to latch the first data bit Add_Da_1 of the address data; the second write latch sub-circuit 202 is configured to be turned on in response to the second write control signal In_Ctr_2 to latch the second data bit Add_Da_2 of the address data; the third write latch sub-circuit 203 is configured to be turned on in response to the third write control signal In_Ctr_3 to latch the third data bit Add_Da_3 of the address data; the fourth write latch sub-circuit 204 is configured to be turned on in response to the fourth write control signal In_Ctr_4 to latch the fourth data bit Add_Da_4 of the address data; the fifth write latch sub-circuit 205 is configured to be turned on in response to the fifth write control signal In_Ctr_5 to latch the fifth data bit Add_Da_5 of the address data; the sixth write latch sub-circuit 206 is configured to be turned on in response to the sixth write control signal In_Ctr_6 to latch the sixth data bit Add_Da_6 of the address data; the seventh write latch sub-circuit 207 is configured to be turned on in response to the seventh write control signals In_Ctr_7 to latch the seventh data bit Add_Da_7 of the address data; and the eighth write latch sub-circuit 208 is configured to be turned on in response to the eighth write control signal In_Ctr_8 to latch the eighth data bit Add_Da_8 of the address data.

It should be noted that although the case where the write latch circuit includes eight (i.e., N=8) write latch sub-circuits is illustrated in FIG. 4, the embodiments of the present disclosure are obviously not limited thereto. The number of write latch sub-circuits included in the write latch circuit can be set according to the number of data bits included in the address data to be latched. For example, the number of write latch sub-circuits can be equal to the number of data bits included in the address data. For example, if the address data to be latched includes 6 data bits, the write latch circuit may include 6 write latch sub-circuits to latch the 6 data bits of the address data, or if the address data to be latched includes 10 data bits, the write latch circuit may include 10 write latch sub-circuits to latch the 10 data bits of the address data.

For example, in the address latch provided by the embodiment of the present disclosure, the latch control circuit includes a primary latch control circuit and a secondary latch control circuit. The primary latch control circuit is configured to generate L primary latch control signals in response to a latch enable signal, a first control signal, and a second control signal; the secondary latch control circuit is configured to generate L secondary latch control signals in response to the first control signal, the second control signal, and the L primary latch control signals, M secondary latch control signals of the L secondary latch control signals are used as the M latch control signals, and L is a positive integer greater than or equal to M.

Figure 5:
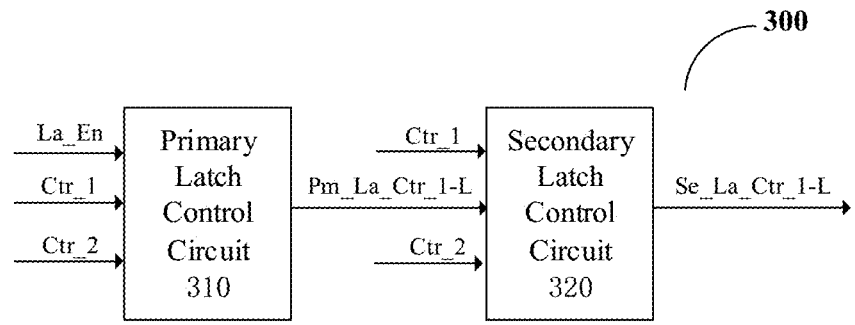
FIG. 5 is a block diagram of a latch control circuit in the address latch illustrated in FIGS. 2A and 2B.

FIG. 5 is a block diagram of the latch control circuit in the address latches illustrated in FIG. 2A and FIG. 2B.

As illustrated in FIG. 5, the latch control circuit 300 includes a primary latch control circuit 310 and a secondary latch control circuit 320.

As illustrated in FIG. 5, the primary latch control circuit 310 is configured to generate L primary latch control signals Pm_La_Ctr_1-L based on a latch enable signal La_En, a first control signal Ctr_1, and a second control signal Ctr_2. As illustrated in FIG. 5, the secondary latch control circuit 320 is configured to generate L secondary latch control signals Se_La_Ctr_1-based on the first control signal Ctr_l, the second control signal Ctr_2, and the L primary latch control signals Pm_La_Ctr_1-L, M secondary latch control signals of the L secondary latch control signals Se_La_Ctr_1-L can be used as the M latch control signals La_Ctr_1-M, and L is a positive integer greater than or equal to M.

For example, in the latch control circuit in the address latch provided by the embodiment of the present disclosure, the primary latch control circuit includes L primary latch control sub-circuits, the L primary latch control sub-circuits are cascaded, each primary latch control sub-circuit includes a control terminal, an input terminal, and an output terminal.

The control terminal of a (2l−1)-th primary latch control sub-circuit of the L primary latch control sub-circuits is connected to a first control signal line to receive the first control signal, and the control terminal of the 2l-th primary latch control sub-circuit of the L primary latch control sub-circuits is connected to a second control signal line to receive the second control signal, 1≤l≤L, and l is a positive integer, that is, the control terminals of any two adjacent primary latch control sub-circuits are respectively connected to the first control signal line and the second control signal line. For example, if the control terminal of the even-numbered primary latch control sub-circuit is connected to the first control signal line, the control terminal of the odd-numbered primary latch control sub-circuit is connected to the second control signal line; on the contrary, if the control terminal of the even-numbered primary latch control sub-circuit is connected to the second control signal line, the control terminal of the odd-numbered primary latch control sub-circuit is connected to the first control signal line.

The input terminal of the first primary latch control sub-circuit of the L primary latch control sub-circuits is connected to an enable signal line to receive the latch enable signal, the output terminal of the p-th primary latch control sub-circuit of the L primary latch control sub-circuits is connected to the input terminal of the (p+1)-th primary latch control sub-circuit, 1≤p≤L−1, and p is a positive integer, that is, except for the first primary latch control sub-circuit, the input terminal of each of the other primary latch control sub-circuits is connected to the output terminal of a previous primary latch control sub-circuit. The output terminals of the L primary latch control sub-circuits respectively output the L primary latch control signals.

For example, in the latch control circuit in the address latch provided by the embodiment of the present disclosure, the secondary latch control circuit includes L secondary latch control sub-circuits, and each secondary latch control sub-circuit includes a control terminal, an input terminal, and an output terminal.

The input terminal of the (2l−1)-th secondary latch control sub-circuit of the L secondary latch control sub-circuits is connected to the second control signal line to receive the second control signal, the input terminal of the 2l-th secondary latch control sub-circuit of the L secondary latch control sub-circuits is connected to the first control signal line to receive the first control signal, and the control terminals of the L secondary latch control sub-circuits are connected to the output terminals of the L primary latch control sub-circuits in one-to-one correspondence manner, the output terminals of the L secondary latch control sub-circuits output the L secondary latch control signals, respectively.

It should be noted that the L primary latch control sub-circuits are in one-to-one correspondence with the L secondary latch control sub-circuits, and the control terminals of the primary latch control sub-circuit and the secondary latch control sub-circuit, which corresponds to the primary latch control sub-circuit, are connected to the first control signal line and the second control signal line, respectively.

Figure 6:
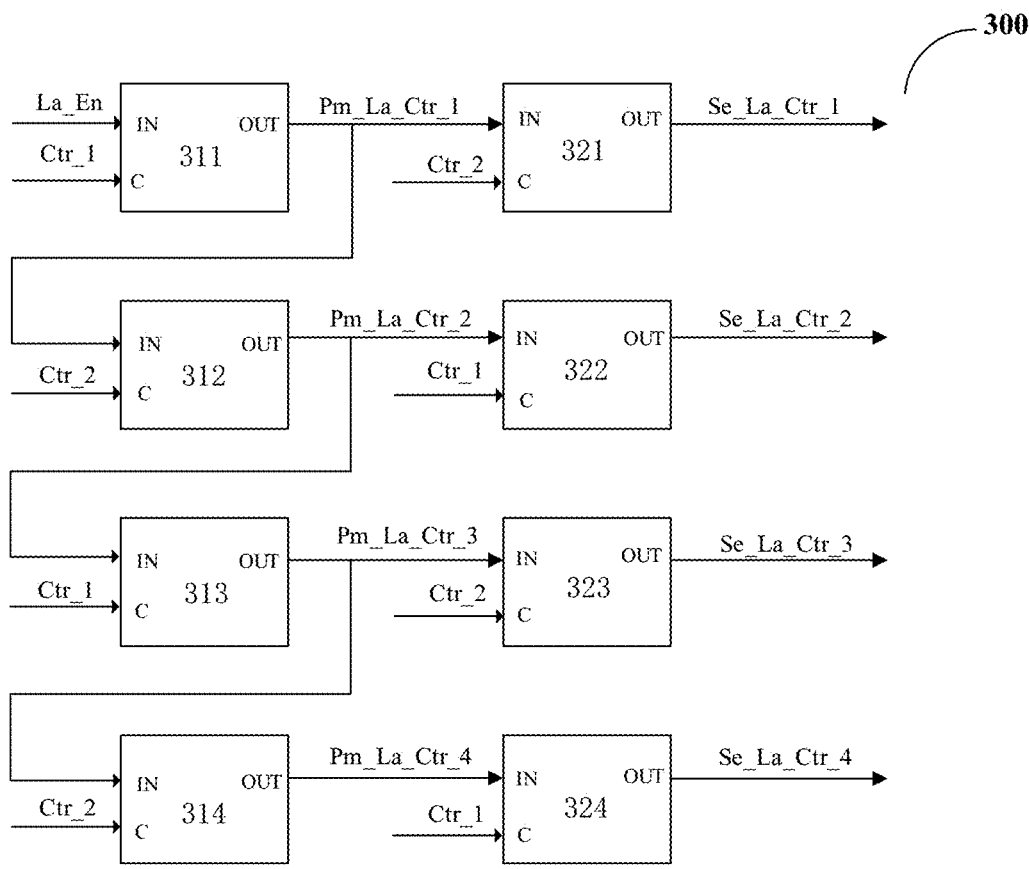
FIG. 6 is a schematic diagram of a primary latch control circuit and a secondary latch control circuit in the latch control circuit illustrated in FIG. 5.

FIG. 6 is a schematic diagram of the primary latch control circuit and the secondary latch control circuit in the latch control circuit illustrated in FIG. 5. FIG. 6 illustrates a case where the primary latch control circuit 310 includes four (i.e., L=4) primary latch control sub-circuits and the secondary latch control circuit 320 includes four (i.e., L=4) secondary latch control sub-circuits. In this case, the primary latch control circuit 310 is configured to generate four primary latch control signals, and the four primary latch control signals are a first primary latch control signal Pm_La_Ctr_1, a second primary latch control signal Pm_La_Ctr_2, a third primary latch control signal Pm_La_Ctr_3, and a fourth primary latch control signal Pm_La_Ctr_4. respectively; the secondary latch control circuit 320 is configured to generate four secondary latch control signals, and the four secondary latch control signals are a first secondary latch control signal Se_La_Ctr_1, a second secondary latch control signal Se_La_Ctr_2, a third secondary latch control signal Se_La_Ctr_3, and a fourth secondary latch control signal Se_La_Ctr_4, respectively.

As illustrated in FIG. 6, the primary latch control circuit 310 includes a first primary latch control sub-circuit 311, a second primary latch control sub-circuit 312, a third primary latch control sub-circuit 313, and a fourth primary latch control sub-circuit 314.

As illustrated in FIG. 6, each of the primary latch control sub-circuits in the primary latch control circuit 310 includes a control terminal C, an input terminal IN, and an output terminal OUT.

As illustrated in FIG. 6, the input terminal IN of the first primary latch control sub-circuit 311 is connected to an enable signal line to receive a latch enable signal La_En.

For example, as illustrated in FIG. 6, the control terminals C of the first primary latch control sub-circuit 311 and the third primary latch control sub-circuit 313 are connected to a first control signal line to receive a first control signal Ctr_1. The control terminals C of the second primary latch control sub-circuit 312 and the fourth primary latch control sub-circuit 314 are connected to a second control signal line to receive a second control signal Ctr_2.

For example, as illustrated in FIG. 6, the output terminal OUT of the first primary latch control sub-circuit 311 is connected to the input terminal IN of the second primary latch control sub-circuit 312, the output terminal OUT of the second primary latch control sub-circuit 312 is connected to the input terminal IN of the third primary latch control sub-circuit 313, and the output terminal OUT of the third primary latch control sub-circuit 313 is connected to the input terminal IN of the fourth primary latch control sub-circuit 314.

As illustrated in FIG. 6, the output terminal OUT of the first primary latch control sub-circuit 311 outputs the first primary latch control signal Pm_La_Ctr_1, the output terminal OUT of the second primary latch control sub-circuit 312 outputs the second primary latch control signal Pm_La_Ctr_2, the output terminal OUT of the third primary latch control sub-circuit 313 outputs the third primary latch control signal Pm_La_Ctr_3, and the output terminal OUT of the fourth primary latch control sub-circuit 314 outputs the fourth primary latch control signal Pm_La_Ctr_4.

As illustrated in FIG. 6, the secondary latch control circuit 320 includes a first secondary latch control sub-circuit 321, a second secondary latch control sub-circuit 321, a third secondary latch control sub-circuit 323, and a fourth secondary latch control sub-circuit 324. For example, the first secondary latch control sub-circuit 321 corresponds to the first primary latch control sub-circuit 311, the second secondary latch control sub-circuit 321 corresponds to the second primary latch control sub-circuit 311, and the third secondary latch control sub-circuit 321 corresponds to the third primary latch control sub-circuit 311, and the fourth secondary latch control sub-circuit 321 corresponds to the fourth primary latch control sub-circuit 311.

As illustrated in FIG. 6, each of the secondary latch control sub-circuits in the secondary latch control circuit 320 includes a control terminal C, an input terminal IN, and an output terminal OUT.

As illustrated in FIG. 6, the control terminals C of the first secondary latch control sub-circuit 321 and the third secondary latch control sub-circuit 323 are connected to the second control signal line to receive the second control signal Ctr_2. The control terminals C of the second secondary latch control sub-circuit 322 and the fourth secondary latch control sub-circuit 324 are connected to the first control signal line to receive the first control signal Ctr_1.

As illustrated in FIG. 6, the input terminal IN of the first secondary latch control sub-circuit 321 is connected to the output terminal OUT of the first primary latch control sub-circuit 311 to receive the first primary latch control signal Pm_La_Ctr_1, the input terminal IN of the second secondary latch control sub-circuit 322 is connected to the output terminal OUT of the second primary latch control sub-circuit 312 to receive the second primary latch control signal Pm_La_Ctr_2, the input terminal IN of the third secondary latch control sub-circuit 323 is connected to the output terminal OUT of the third primary latch control sub-circuit 313 to receive the third primary latch control signal Pm_La_Ctr_3, and the input terminal IN of the fourth secondary latch control sub-circuit 324 is connected to the output terminal OUT of the fourth primary latch control sub-circuit 314 to receive the fourth primary latch control signal Pm_La_Ctr_4.

As illustrated in FIG. 6, the output terminal OUT of the first secondary latch control sub-circuit 321 outputs the first secondary latch control signal Se_La_Ctr_1, the output terminal OUT of the second secondary latch control sub-circuit 322 outputs the second secondary latch control signal Se_La_Ctr_2, the output terminal OUT of the third secondary latch control sub-circuit 323 outputs the third secondary latch control signal Se_La_Ctr_3, and the output terminal OUT of the fourth secondary latch control sub-circuit 324 outputs the fourth secondary latch control signal Se_La_Ctr_4.

For example, in the embodiment illustrated in FIG. 6, in term of time order, the first secondary latch control signal Se_La_Ctr_1, the second secondary latch control signal Se_La_Ctr_2, the third secondary latch control signal Se_La_Ctr_3, and the fourth secondary latch control signals Se_La_Ctr_4 are sequentially output, that is, the first secondary latch control signal Se_La_Ctr_1 is output at the first moment, the second secondary latch control signal Se_La_Ctr_2 is output at the second moment after the first moment, similarly, the third secondary latch control signal Se_La_Ctr_3 is output at the third moment after the second moment, and the fourth secondary latch control signal Se_La_Ctr_4 is output at the fourth moment after the third moment.

For the embodiment illustrated in FIG. 6, in some cases, the latch control circuit needs to sequentially generate three (i.e., M=3) latch control signals, and the three latch control signals may be a first latch control signal La_Ctr1, a second latch control signal La_Ctr2, and a third latch control signal La_Ctr3, respectively. In this case, three secondary latch control signals can be selected from the first secondary latch control signal Se_La_Ctr_1, the second secondary latch control signal Se_La_Ctr_2, the third secondary latch control signal Se_La_Ctr_3, and the fourth secondary latch control signal Se_La_Ctr_4 to be used as the three latch control signals.

For example, in some examples, the first secondary latch control signal Se_La_Ctr_1 may be used as the first latch control signal La_Ctr1, the third secondary latch control signal Se_La_Ctr_3 may be used as the second latch control signal La_Ctr2, and the fourth secondary latch control signals Se_La_Ctr_4 may be used as the third latch control signal La_Ctr3. In this case, the second secondary latch control signal Se_La_Ctr_2 may not be used to control the intermediate latch circuit. However, the embodiments of the present disclosure are not limited thereto. For example, in other examples, the second secondary latch control signal Se_La_Ctr_2 may be used as the first latch control signal La_Ctr1, the third secondary latch control signal Se_La_Ctr_3 may be used as the second latch control signal La_Ctr2, and the fourth secondary latch control signal Se_La_Ctr_4 may be used as the third latch control signal La_Ctr3. In this case, the first secondary latch control signal Se_La_Ctr_1 may not be used to control the intermediate latch circuit.

For the embodiment illustrated in FIG. 6, in some other cases, the latch control circuit needs to sequentially generate four (i.e., M=4) latch control signals, and the four latch control signals may be a first latch control signal La_Ctr1, a second latch control signal La_Ctr2, a third latch control signal La_Ctr3, and a fourth latch control signal La_Ctr4, respectively. In this case, the first secondary latch control signal Se_La_Ctr_1, the second secondary latch control signal Se_La_Ctr_2, the third secondary latch control signal Se_La_Ctr_3, and the fourth secondary latch control signal Se_La_Ctr_4 may be used as the four latch control signals, respectively.

For example, the first secondary latch control signal Se_La_Ctr_1 can be used as the first latch control signal La_Ctr1, the second secondary latch control signal Se_La_Ctr_2 can be used as the second latch control signal La_Ctr2, the third secondary latch control signal Se_La_Ctr_3 can be used as the third latch control signal La_Ctr3, and the fourth secondary latch control signal Se_La_Ctr_4 can be used as the fourth latch control signal La_Ctr4.

It should be noted that although the case where the primary latch control circuit includes four (i.e., L=4) primary latch control sub-circuits and the secondary latch control circuit includes four (i.e., L=4) secondary latch control sub-circuits is illustrated in FIG. 4, the embodiments of the present disclosure are obviously not limited thereto. The number of primary latch control sub-circuits included in the primary latch control circuit and the number of secondary latch control sub-circuits included in the secondary latch control circuit can be set according to the number of data bit groups in the address data. For example, in a case where the N data bits of the address data are divided into 2 data bit groups to be latched, the primary latch control circuit may include 3 or 4 primary latch control sub-circuits and the secondary latch control circuit may include 3 or 4 secondary latch control sub-circuits to generate 3 latch control signals, 2 of the 3 latch control signals can control the intermediate latch circuit to sequentially latch the 2 data bit groups in a time-division manner. For another example, in a case where the N data bits of the address data are divided into 4 data bit groups to be latched, the primary latch control circuit may include 5 or 6 primary latch control sub-circuits and the secondary latch control circuit may include 5 or 6 secondary latch control sub-circuits to generate 5 latch control signals, 4 of the 5 latch control signals can control the intermediate latch circuit to sequentially latch the 4 data bit groups in a time-division manner.

For example, in the address latch provided by the embodiment of the present disclosure, the intermediate latch circuit includes N intermediate latch sub-circuits, the N intermediate latch sub-circuits are divided into (M−1) intermediate latch sub-circuit groups, the (M−1) intermediate latch sub-circuit groups are configured to latch, in response to the first to (M−1)-th latch control signals, respectively, the (M−1) data bit groups of the address data at first to (M−1)-th moments, respectively.

For example, the N intermediate latch sub-circuits are connected to the N write latch sub-circuits in one-to-one correspondence manner.

For example, each intermediate latch sub-circuit group includes at least one intermediate latch sub-circuit. In the case where each intermediate latch sub-circuit group includes a plurality of intermediate latch sub-circuits, the plurality of intermediate latch sub-circuits may be adjacent to each other or not adjacent to each other.

For example, each intermediate latch sub-circuit includes a control terminal, an input terminal, and an output terminal. The input terminals of the N intermediate latch sub-circuits are connected to the output terminals of the N write latch sub-circuits in one-to-one correspondence manner, so that the input terminal of each intermediate latch sub-circuit can receive a corresponding data bit in the address data latched by a corresponding write latch sub-circuit. The control terminals of each of the (M−1) intermediate latch sub-circuit groups are configured to receive a corresponding latch control signal of the first to (M−1)-th latch control signals. The output terminals of the N intermediate latch sub-circuits are connected to the output latch circuit.

Figure 7A:
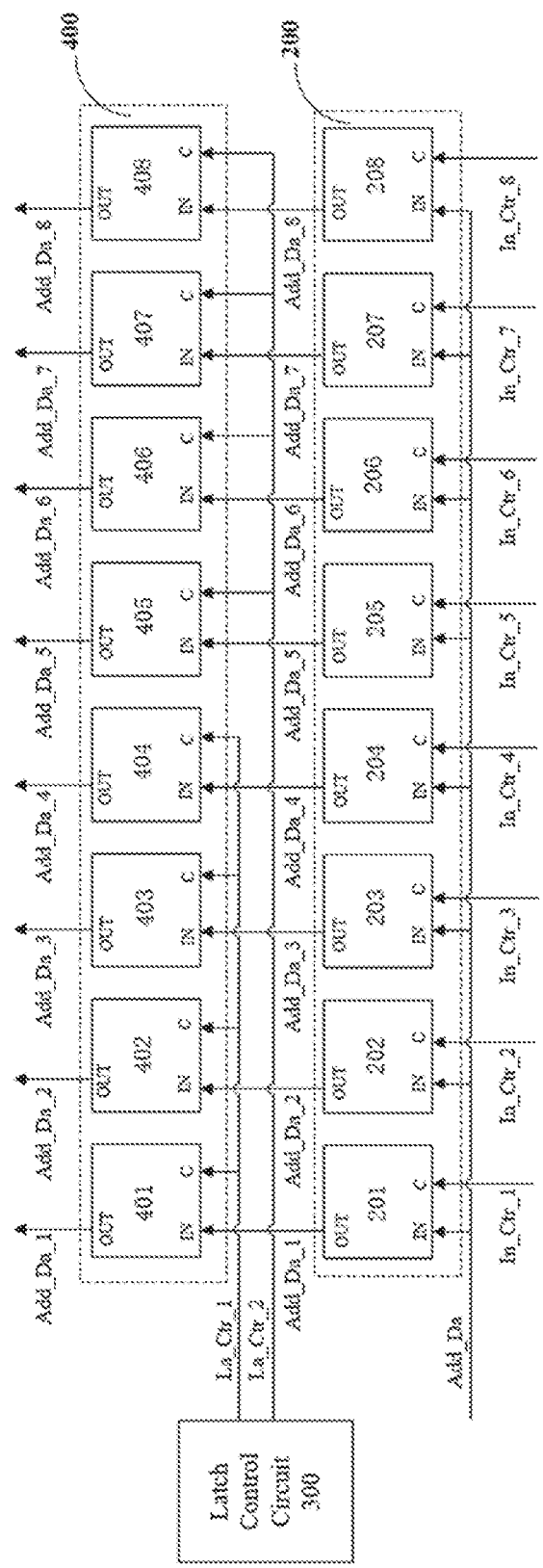
FIGS. 7A and 7B are schematic diagrams of intermediate latch circuits in the address latches illustrated in FIGS. 2A and 2B, respectively.
Figure 7B:
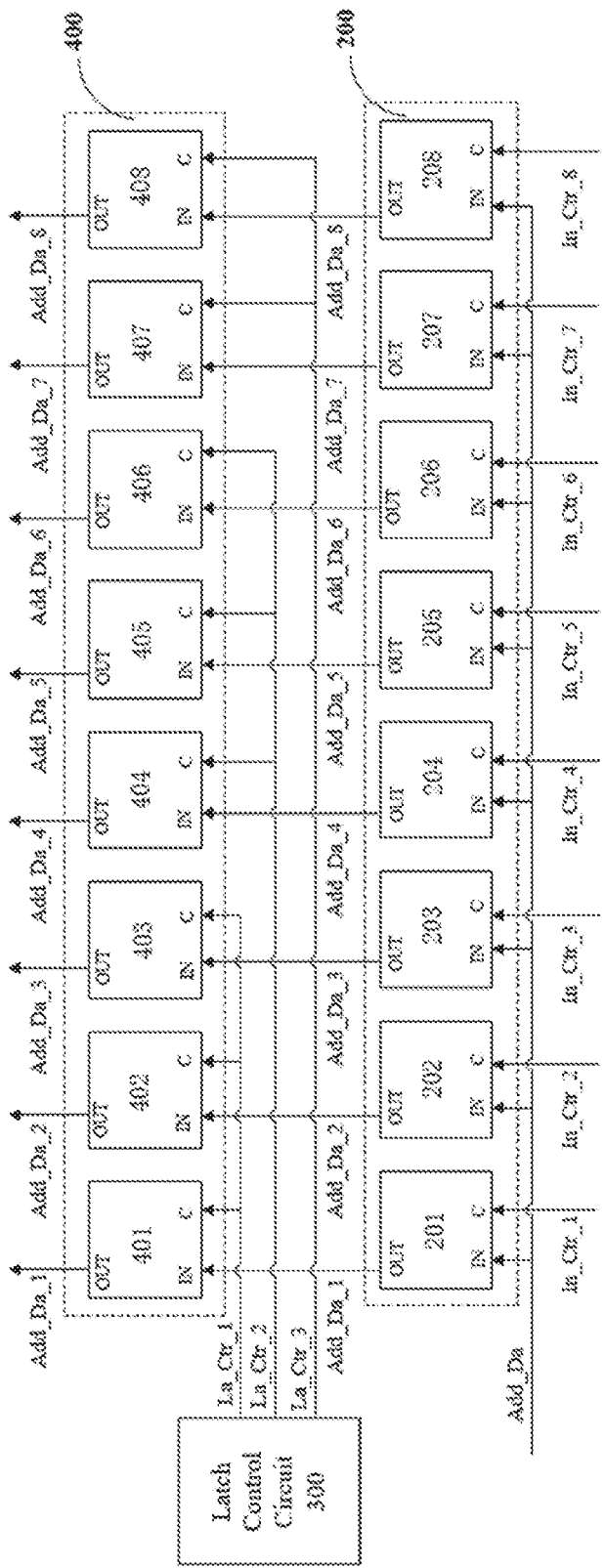

FIG. 7A and FIG. 7B are schematic diagrams of the intermediate latch circuits in the address latches illustrated in FIG. 2A and FIG. 2B. FIG. 7A and FIG. 7B illustrate a case where the intermediate latch circuit 400 includes eight (i.e., N=8) intermediate latch sub-circuits.

As illustrated in FIGS. 7A and 7B, the intermediate latch circuit 400 includes a first intermediate latch sub-circuit 401, a second intermediate latch sub-circuit 402, a third intermediate latch sub-circuit 403, a fourth intermediate latch sub-circuit 404, a fifth intermediate latch sub-circuit 405, a sixth intermediate latch sub-circuit 406, a seventh intermediate latch sub-circuit 407, and an eighth intermediate latch sub-circuit 408.

As illustrated in FIG. 7A and FIG. 7B, each of the intermediate latch sub-circuits in the intermediate latch circuit 400 may include a control terminal C, an input terminal IN, and an output terminal OUT.

As illustrated in FIG. 7A and FIG. 7B, the input terminal IN of the first intermediate latch sub-circuit 401 is connected to the output terminal OUT of the first write latch sub-circuit 201 to receive the first data bit Add_Da_1 of the address data latched by the first write latch sub-circuit 201; the input terminal IN of the second intermediate latch sub-circuit 402 is connected to the output terminal OUT of the second write latch sub-circuit 202 to receive the second data bit Add_Da_2 of the address data latched by the second write latch sub-circuit 202; the input terminal IN of the third intermediate latch sub-circuit 403 is connected to the output terminal OUT of the third write latch sub-circuit 201 to receive the third data bit Add_Da_3 of the address data lock latched by the third write latch sub-circuit 203; the input terminal IN of the fourth intermediate latch sub-circuit 401 is connected to the output terminal OUT of the fourth write latch sub-circuit 204 to receive the fourth data bit Add_Da_4 of the address data latched by the fourth write latch sub-circuit 204; the input terminal IN of the fifth intermediate latch sub-circuit 405 is connected to the output terminal OUT of the fifth write latch sub-circuit 205 to receive the fifth data bit Add_Da_5 of the address data latched by the fifth write latch sub-circuit 205; the input terminal IN of the sixth intermediate latch sub-circuit 406 is connected to the output terminal OUT of the sixth write latch sub-circuit 206 to receive the sixth data bit Add_Da_6 of the address data latched by the sixth write latch sub-circuit 206; the input terminal IN of the seventh intermediate latch sub-circuit 407 is connected to the output terminal OUT of the seventh write latch sub-circuit 207 to receive the seventh data bit Add_Da_7 of the address data latched by the seventh write latch sub-circuit 207; the input terminal IN of the eighth intermediate latch sub-circuit 408 is connected to the output terminal OUT of the eighth write latch sub-circuit 208 to receive the eighth data bit Add_Da_8 of the address data latched by the eighth write latch sub-circuit 208.

For example, in some embodiments, as illustrated in FIG. 7A, the first intermediate latch sub-circuit 401 to the eighth intermediate latch sub-circuit 408 may be divided into two groups, i.e., the first intermediate latch sub-circuit group and the second intermediate latch sub-circuit group, the first intermediate latch sub-circuit group includes the first intermediate latch sub-circuit 401, the second intermediate latch sub-circuit 402, the third intermediate latch sub-circuit 403, and the fourth intermediate latch sub-circuit 404; and the second intermediate latch sub-circuit group includes the fifth intermediate latch sub-circuit 405, the sixth intermediate latch sub-circuit 406, the seventh intermediate latch sub-circuit 407, and the eighth intermediate latch sub-circuit 408.

As illustrated in FIG. 7A, the control terminal C of each intermediate latch sub-circuit in the first intermediate latch sub-circuit group is configured to receive the first latch control signal La_Ctr_1 generated by the latch control circuit 300, and the control terminal C of each intermediate latch sub-circuit in the second intermediate latch sub-circuit group is configured to receive the second latch control signal La_Ctr_2 generated by the latch control circuit 300.

It should be noted that, as described above with reference to FIG. 6, the first latch control signal La_Ctr_1 in FIG. 7A may be the first secondary latch control signal Se_La_Ctr_1 or the second secondary latch control signal Se_La_Ctr_2 in FIG. 6, and the second latch control signal La_Ctr_2 in FIG. 7A may be the third secondary latch control signal Se_La_Ctr_3 in FIG. 6. In this case, the control terminal C of each intermediate latch sub-circuit in the first intermediate latch sub-circuit group in FIG. 7A may be connected to the output terminal OUT of the first secondary latch control sub-circuit 321 in FIG. 6 or the output terminal OUT of the second secondary latch control sub-circuit 322, and the control terminal C of each intermediate latch sub-circuit in the second intermediate latch sub-circuit group in FIG. 7A may be connected to the output terminal OUT of the third secondary latch control sub-circuit 323 in FIG. 6.

As illustrated in FIG. 7A, the respective intermediate latch sub-circuits in the first intermediate latch sub-circuit group are configured to latch the first data bit group of the address data at the first moment in response to the first latch control signal La_Ctr_1, and the first data bit group includes the first data bit Add_Da_1, the second data bit Add_Da_2, the third data bit Add_Da_3, and the fourth data bit Add_Da_4; and the respective intermediate latch sub-circuits in the second intermediate latch sub-circuit group are configured to latch the second data bit group of the address data at the second moment in response to the second latch control signal La_Ctr_2, and the second data bit group includes the fifth data bit Add_Da_5, the sixth data bit Add_Da_6, the seventh data bit Add_Da_7, and the eighth data bit Add_Da_8.

For example, in some other embodiments, as illustrated in FIG. 7B, the first intermediate latch sub-circuit 401 to the eighth intermediate latch sub-circuit 408 may be divided into three groups, i.e., a first intermediate latch sub-circuit group, a second intermediate latch sub-circuit groups, and a third intermediate latch sub-circuit group. The first intermediate latch sub-circuit group includes the first intermediate latch sub-circuit 401, the second intermediate latch sub-circuit 402, and the third intermediate latch sub-circuit 403; the second intermediate latch sub-circuit group includes the fourth intermediate latch sub-circuit 404, the fifth intermediate latch sub-circuit 405, and the sixth intermediate latch sub-circuit 406; and the third intermediate latch sub-circuit group includes the seventh intermediate latch sub-circuit 407 and the eighth intermediate latch sub-circuit 408.

As illustrated in FIG. 7B, the control terminal C of each intermediate latch sub-circuit in the first intermediate latch sub-circuit group is configured to receive the first latch control signal La_Ctr_1 generated by the latch control circuit 300, and the control terminal C of each intermediate latch sub-circuit in the second intermediate latch sub-circuit group is configured to receive the second latch control signal La_Ctr_2 generated by the latch control circuit 300, and the control terminal C of each intermediate latch sub-circuit in the third intermediate latch sub-circuit group is configured to receive the third latch control signal La_Ctr_3 generated by the latch control circuit 300.

It should be noted that, as described above with reference to FIG. 6, the first latch control signal La_Ctr_1 in FIG. 7B may be the first secondary latch control signal Se_La_Ctr_1 in FIG. 6, the second latch control signal La_Ctr_2 in FIG. 7B may be the second secondary latch control signal Se_La_Ctr_2 in FIG. 6, and the third latch control signal La_Ctr_3 in FIG. 7B may be the third secondary latch control signal Se_La_Ctr_3 in FIG. 6. In this case, the control terminal C of each intermediate latch sub-circuit in the first intermediate latch sub-circuit group in FIG. 7B may be connected to the output terminal OUT of the first secondary latch control sub-circuit 321 in FIG. 6, the control terminal C of each intermediate latch sub-circuit in the second intermediate latch sub-circuit group in 7B may be connected to the output terminal OUT of the second secondary latch control sub-circuit 322 in FIG. 6, and the control terminal C of each intermediate latch sub-circuit in the third intermediate latch sub-circuit group may be connected to the output terminal OUT of the third secondary latch control sub-circuit 323 in FIG. 6.

As illustrated in FIG. 7B, the respective intermediate latch sub-circuits in the first intermediate latch sub-circuit group are configured to latch the first data bit group in the address data at the first moment in response to the first latch control signal La_Ctr_1, and the first data bit group includes the first data bit Add_Da_1, the second data bit Add_Da_2, and the third data bit Add_Da_3; the respective intermediate latch sub-circuit in the second intermediate latch sub-circuit group are configured to latch the second data bit group in the address data at the second moment in response to the second latch control signal La_Ctr_2, and the second data bit group includes the fourth data bit Add_Da_4, the fifth data bit Add_Da_5, and the sixth data bit Add_Da_6; and the respective intermediate latch sub-circuit in the third intermediate latch sub-circuit group are configured to latch the third data bit group in the address data at the third moment in response to the third latch control signal La_Ctr_3, and the third data bit group includes the seventh data bit Add_Da_7 and the eighth data bit Add_Da_8.

It should be noted that although the case where the intermediate latch circuit includes eight (i.e., N=8) intermediate latch sub-circuits is illustrated in FIG. 7A and FIG. 7B, the embodiments of the present disclosure are obviously not limited thereto. The number of intermediate latch sub-circuits included in the intermediate latch circuit can be set according to the number of data bits included in the address data to be latched. For example, if the address data to be latched includes 6 data bits, the intermediate latch circuit may include 6 intermediate latch sub-circuits to latch the 6 data bits of the address data, or if the address data to be latched includes 10 data bits, the intermediate latch circuit may include 10 intermediate latch sub-circuits to latch the 10 data bits of the address data.

It should be noted that although the case where the respective intermediate latch sub-circuits in each intermediate latch sub-circuit group are adjacent to each other is illustrated in FIGS. 7A and 7B, the embodiments of the present disclosure are obviously not limited thereto. The respective intermediate latch sub-circuits in each intermediate latch sub-circuit group may not be adjacent to each other. In the embodiment of the present disclosure, "adjacent to each other" indicates that there is no intermediate latch sub-circuit of another intermediate latch sub-circuit group between two intermediate latch sub-circuits in one intermediate latch sub-circuit group; "not adjacent to each other" indicates that there are one or more intermediate latch sub-circuits of another intermediate latch sub-circuit group between two intermediate latch sub-circuits in one intermediate latch sub-circuit group. If the two intermediate latch sub-circuits are adjacent to each other, this indicates that the data bits of the address data latched by the two intermediate latch sub-circuits are also adjacent to each other.

For example, the first intermediate latch sub-circuit group in FIG. 7A may include the first intermediate latch sub-circuit 401, the second intermediate latch sub-circuit 402, the third intermediate latch sub-circuit 403, and the fifth intermediate latch sub-circuit 405, and the second intermediate latch sub-circuit group may include the fourth intermediate latch sub-circuit 404, the sixth intermediate latch sub-circuit 406, the seventh intermediate latch sub-circuit 407, and the eighth intermediate latch sub-circuit 408. For another example, the first intermediate latch sub-circuit group in FIG. 7B may include the first intermediate latch sub-circuit 401, the second intermediate latch sub-circuit 402, and the fourth intermediate latch sub-circuit 404, the second intermediate latch sub-circuit group may include the third intermediate latch sub-circuit 403, the fifth intermediate latch sub-circuit 405, and the sixth intermediate latch sub-circuit 406, and the third intermediate latch sub-circuit group may include the seventh intermediate latch sub-circuit 407 and the eighth intermediate latch sub-circuit 408.

It should be noted that although two grouping cases of the intermediate latch sub-circuits in the intermediate latch circuit are illustrated in FIG. 7A and FIG. 7B, the embodiments of the present disclosure are obviously not limited thereto. The intermediate latch sub-circuits in the intermediate latch circuit may also have other grouping cases, and each intermediate latch sub-circuit group may include other numbers of intermediate latch sub-circuits. For example, the first intermediate latch sub-circuit group in FIG. 7A may include the first intermediate latch sub-circuit 401, the second intermediate latch sub-circuit 402, and the third intermediate latch sub-circuit 403, and the second intermediate latch sub-circuit group may include the fourth intermediate latch sub-circuit 404, the fifth intermediate latch sub-circuit 405, the sixth intermediate latch sub-circuit 406, the seventh intermediate latch sub-circuit 407, and the eighth intermediate latch sub-circuit 408. For another example, the first intermediate latch sub-circuit group in FIG. 7B may include the first intermediate latch sub-circuit 401 and the second intermediate latch sub-circuit 402, the second intermediate latch sub-circuit group may include the third intermediate latch sub-circuit 403 and the fourth intermediate latch sub-circuit 404, and the third intermediate latch sub-circuit group may include the fifth intermediate latch sub-circuit 405, the sixth intermediate latch sub-circuit 406, the seventh intermediate latch sub-circuit 407, and the eighth intermediate latch sub-circuit 408.

For example, in the address latch provided by the embodiment of the present disclosure, the output latch circuit includes N output latch sub-circuits, and the N output latch sub-circuits are connected to the N intermediate latch sub-circuits in one-to-one correspondence manner. The N output latch sub-circuits are configured to output the address data latched by the intermediate latch circuit from the address latch at the M-th moment in response to the M-th latch control signal.

For example, each output latch sub-circuit includes a control terminal, an input terminal, and an output terminal. The input terminals of the N output latch sub-circuits are connected to the output terminals of the N intermediate latch sub-circuits in one-to-one correspondence manner, so that the input terminal of each output latch sub-circuit can receive a corresponding data bit of the address data latched by a corresponding intermediate latch sub-circuit. The control terminals of the N output latch sub-circuits are configured to receive the M-th latch control signal generated by the latch control circuit. In a case where the address latch includes an address decoding circuit, the output terminals of the N output latch sub-circuits may be connected to the address decoding circuit.

Figure 8A:
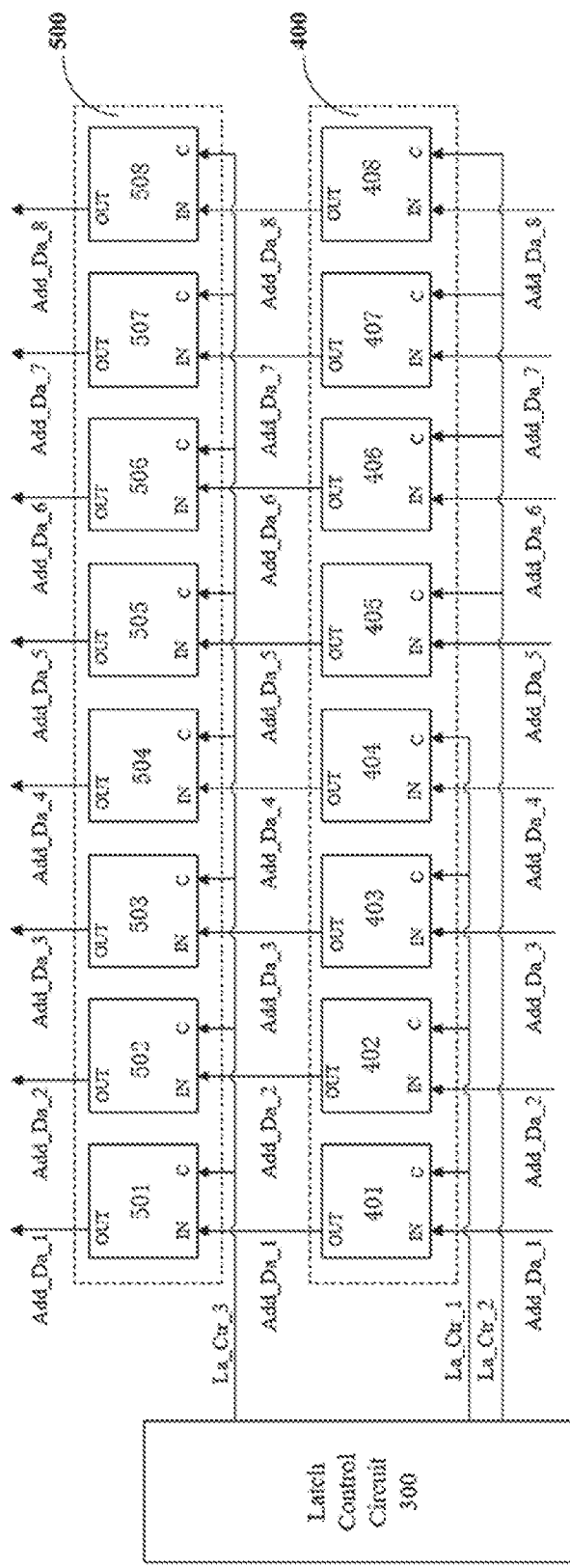
FIGS. 8A and 8B are schematic diagrams of output latch circuits in the address latches illustrated in FIGS. 2A and 2B, respectively.
Figure 8B:
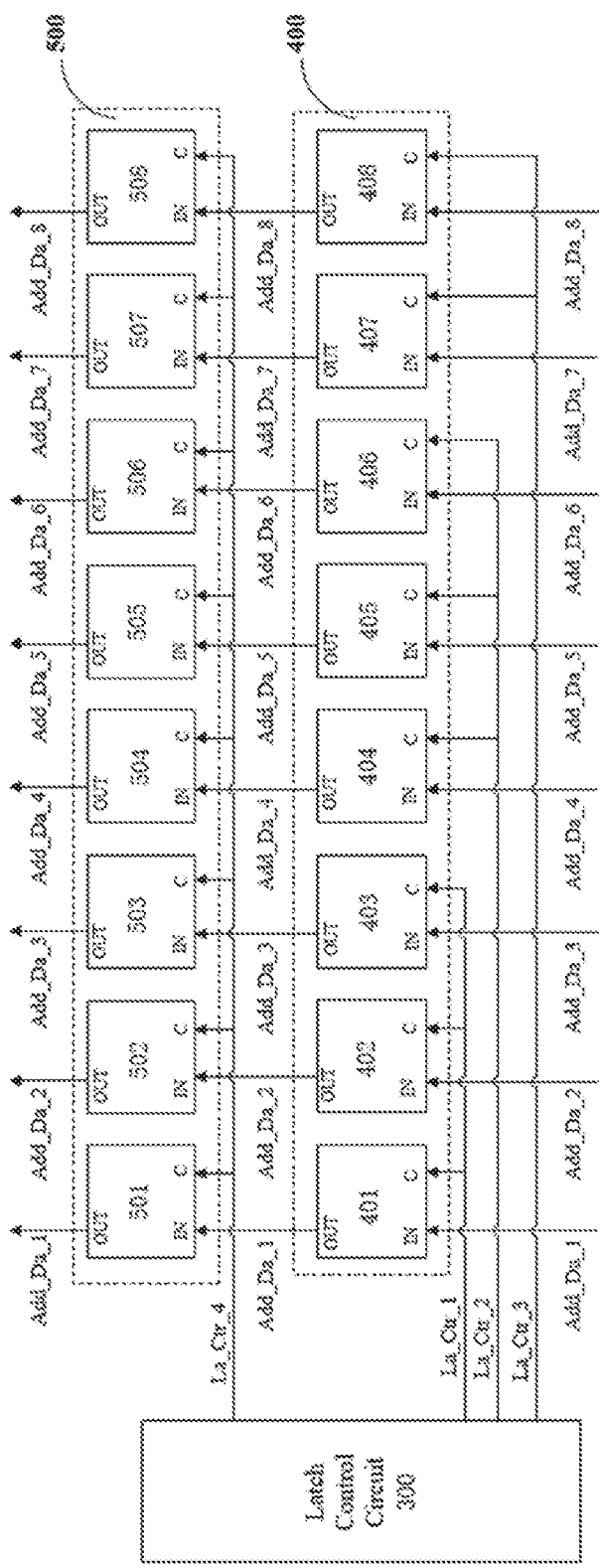

FIG. 8A and FIG. 8B are schematic diagrams of the output latch circuits in the address latches illustrated in FIG. 2A and FIG. 2B. FIG. 8A and FIG. 8B illustrate a case where the output latch circuit 500 includes eight (i.e., N=8) output latch sub-circuits.

As illustrated in FIG. 8A and FIG. 8B, the output latch circuit 500 includes a first output latch sub-circuit 501, a second output latch sub-circuit 502, a third output latch sub-circuit 503, a fourth output latch sub-circuit 504, a fifth output latch sub-circuit 505, a sixth output latch sub-circuit 506, a seventh output latch sub-circuit 507, and an eighth output latch sub-circuit 508.

As illustrated in FIGS. 8A and 8B, each output latch sub-circuit in the output latch circuit 500 includes a control terminal C, an input terminal IN, and an output terminal OUT.

As illustrated in FIGS. 8A and 8B, the input terminal IN of the first output latch sub-circuit 501 is connected to the output terminal OUT of the first intermediate latch sub-circuit 401 to receive the first data bit Add_Da_1 of the address data latched by the first intermediate latch sub-circuit 401; the input terminal IN of the second output latch sub-circuit 502 is connected to the output terminal OUT of the second intermediate latch sub-circuit 402 to receive the second data bits Add_Da_2 of the address data latched by the second intermediate latch sub-circuit 402; the input terminal IN of the third output latch sub-circuit 503 is connected to the output terminal OUT of the third intermediate latch sub-circuit 403 to receive the third data bit Add_Da_3 of the address data latched by the third intermediate latch sub-circuit 403; the input terminal IN of the fourth output latch sub-circuit 504 is connected to the output terminal OUT of the fourth intermediate latch sub-circuit 404 to receive the fourth data bit Add_Da_4 of the address data latched by the fourth intermediate latch sub-circuit 404; the input terminal IN of the fifth output latch sub-circuit 505 is connected to the output terminal OUT of the fifth intermediate latch sub-circuit 405 to receive the fifth data bit Add_Da_5 of the address data latched by the fifth intermediate latch sub-circuit 405; the input terminal IN of the sixth output latch sub-circuit 506 is connected to the output terminal OUT of the sixth intermediate latch sub-circuit 406 to receive the sixth data bit Add_Da_6 of the address data latched by the sixth intermediate latch sub-circuit 406; the input terminal IN of the output latch sub-circuit 507 is connected to the output terminal OUT of the seventh intermediate latch sub-circuit 407 to receive the seventh data bit Add_Da_7 of the address data latched by the seventh intermediate latch sub-circuit 407; and the input terminal IN of the eighth output latch sub-circuit 508 is connected to the output terminal OUT of the eighth intermediate latch sub-circuit 408 to receive the eighth data bit Add_Da_8 of the address data latched by the eighth intermediate latch sub-circuit 408.

As illustrated in FIG. 8A, the control terminals of the first output latch sub-circuit 501 to the eighth output latch sub-circuit 508 are configured to receive the third latch control signal La_Ctr_3 generated by the latch control circuit 300. The intermediate latch circuit in the embodiment illustrated in FIG. 8A is the intermediate latch circuit illustrated in FIG. 7A.

It should be noted that, as described above with reference to FIG. 6, the third latch control signal La_Ctr_3 in FIG. 8A may be the fourth secondary latch control signal Se_La_Ctr_4 in FIG. 6. In this case, the control terminals of the first output latch sub-circuit 501 to the eighth output latch sub-circuit 508 in FIG. 8A may be connected to the output terminal OUT of the fourth secondary latch control sub-circuit 324 in FIG. 6.

As illustrated in FIG. 8A, the first output latch sub-circuit 501 is configured to output the first data bit Add_Da_1 of the address data latched by the first intermediate latch sub-circuit 401 from the address latch in response to the third latch control signal La_Ctr_3; the second output latch sub-circuit 502 is configured to output the second data bit Add_Da_2 of the address data latched by the second intermediate latch sub-circuit 402 from the address latch in response to the third latch control signal La_Ctr_3; the third output latch sub-circuit 503 is configured to output the third data bit Add_Da_3 of the address data latched by the third intermediate latch sub-circuit 403 from the address latch in response to the third latch control signal La_Ctr_3; the fourth output latch sub-circuit 504 is configured to output the fourth data bit Add_Da_4 of the address data latched by the fourth intermediate latch sub-circuit 404 from the address latch in response to the third latch control signal La_Ctr_3; the fifth output latch sub-circuit 505 is configured to output the fifth data bit Add_Da_5 of the address data latched by the fifth intermediate latch sub-circuit 405 from the address latch in response to the third latch control signal La_Ctr_3; the sixth output latch sub-circuit 506 is configured to output the sixth data bit Add_Da_6 of the address data latched by the sixth intermediate latch sub-circuit 406 from the address latch in response to the third latch control signal La_Ctr_3; the seventh output latch sub-circuit 507 is configured to output the seventh data bit Add_Da_7 of the address data latched by the seventh intermediate latch sub-circuit 407 from the address latch in response to the third latch control signal La_Ctr_3; and the eighth output latch sub-circuit 508 is configured to output the eighth data bit Add_Da_8 of the address data latched by the eighth intermediate latch sub-circuit 408 from the address latch in response to the third latch control signal La_Ctr_3.

As illustrated in FIG. 8B, the control terminals of the first to eighth output latch sub-circuits 501 to 508 are configured to receive the fourth latch control signal La_Ctr_4 generated by the latch control circuit 300. In this case, the intermediate latch circuit in the embodiment illustrated in FIG. 8B is the intermediate latch circuit illustrated in FIG. 7B.

It should be noted that, as described above with reference to FIG. 6, the fourth latch control signal La_Ctr_4 in FIG. 8B may be the fourth secondary latch control signal Se_La_Ctr_4 in FIG. 6. In this case, the control terminals of the first to eighth output latch sub-circuits 501 to 508 in FIG. 8B may be connected to the output terminal OUT of the fourth secondary latch control sub-circuit 324 in FIG. 6.

As illustrated in FIG. 8B, the first output latch sub-circuit 501 is configured to output the first data bit Add_Da_1 of the address data latched by the first intermediate latch sub-circuit 401 from the address latch in response to the fourth latch control signal La_Ctr_4; the second output latch sub-circuit 502 is configured to output the second data bit Add_Da_2 of the address data latched by the second intermediate latch sub-circuit 402 from the address latch in response to the fourth latch control signal La_Ctr_4; the third output latch sub-circuit 503 is configured to output the third data bit Add_Da_3 of the address data latched by the third intermediate latch sub-circuit 403 from the address latch in response to the fourth latch control signal La_Ctr_4; the fourth output latch sub-circuit 504 is configured to output the fourth data bit Add_Da_4 of the address data latched by the fourth intermediate latch sub-circuit 404 from the address latch in response to the fourth latch control signal La_Ctr_4; the fifth output latch sub-circuit 505 is configured to output the fifth data bit Add_Da_5 of the address data latched by the fifth intermediate latch sub-circuit 405 from the address latch in response to the fourth latch control signal La_Ctr_4; the sixth output latch sub-circuit 506 is configured to output the sixth data bit Add_Da_6 of the address data latched by the sixth intermediate latch sub-circuit 406 from the address latch in response to the fourth latch control signal La_Ctr_4; the seventh output latch sub-circuit 507 is configured to output the seventh data bit Add_Da_7 of the address data latched by the seventh intermediate latch sub-circuit 407 from the address latch in response to the fourth latch control signal La_Ctr_4; and the eighth output latch sub-circuit 508 is configured to output the eighth data bit Add_Da_8 of the address data latched by the eighth intermediate latch sub-circuit 408 from the address latch in response to the fourth latch control signal La_Ctr_4.

It should be noted that although the case where the output latch circuit includes eight (i.e., N=8) output latch sub-circuits is illustrated in FIG. 8A and FIG. 8B, the embodiments of the present disclosure are obviously not limited thereto. The number of output latch sub-circuits included in the latch circuit can be set according to the number of data bits included in the address data to be latched. For example, the number of output latch sub-circuits included in the output latch circuit can be equal to the number of data bits included in the address data. For example, if the address data to be latched includes 6 data bits, the output latch circuit may include 6 output latch sub-circuits to output the 6 data bits of the address data from the address latch; or if the address data to be latched includes 10 data bits, the output latch circuit may include 10 output latch sub-circuits to output the 10 data bits of the address data from the address latch.

For example, in the address latch provided by the embodiment of the present disclosure, each write control sub-circuit in the write control circuit may be a D flip-flop, each write latch sub-circuit in the write latch circuit may be a D latch, each intermediate latch sub-circuit in the intermediate latch circuit may be a D latch, and each output latch sub-circuit in the output latch circuit may be a D latch.

Figure 9A:
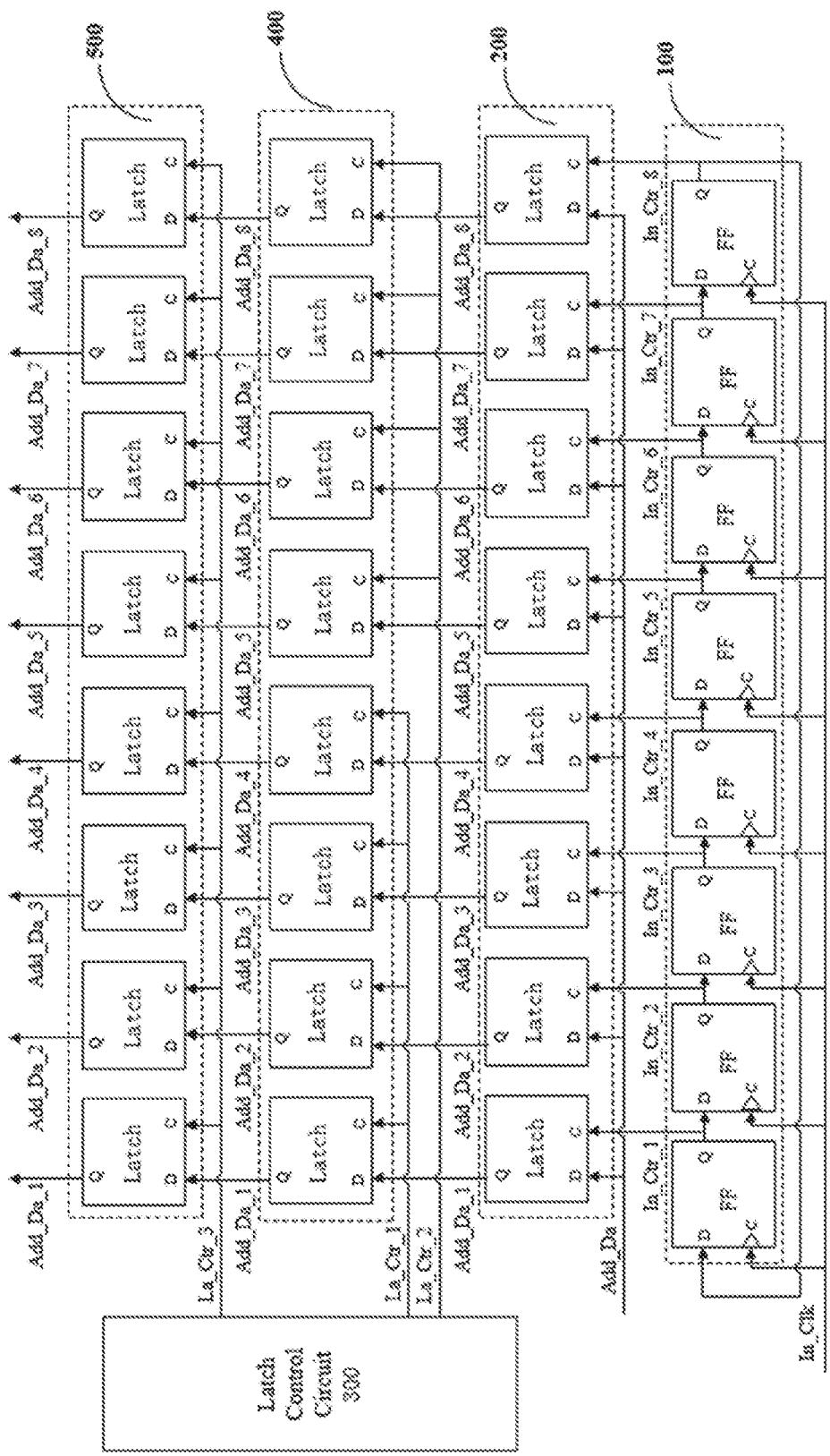
FIG. 9A is a structural diagram of an address latch according to an embodiment of the present disclosure.
Figure 9B:
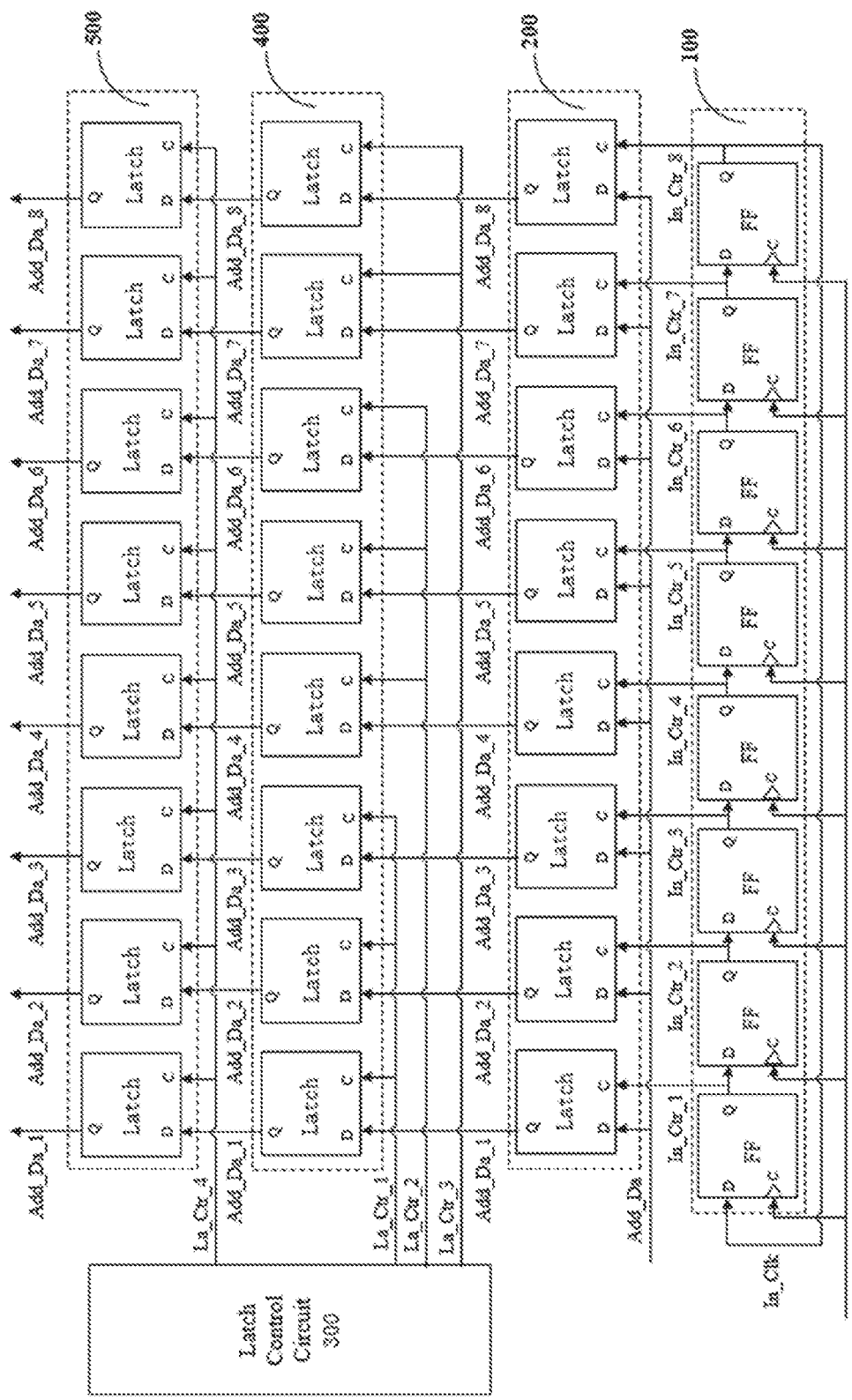
FIG. 9B is a structural diagram of another address latch according to an embodiment of the present disclosure.

FIG. 9A is a structural diagram of an address latch according to an embodiment of the present disclosure. The address latch illustrated in FIG. 9A includes the write control circuit illustrated in FIG. 3, the write latch circuit illustrated in FIG. 4, the intermediate latch circuit illustrated in FIG. 7A, and the output latch circuit illustrated in FIG. 8A. FIG. 9B is a structural diagram of another address latch according to an embodiment of the present disclosure. The address latch illustrated in FIG. 9B includes the write control circuit illustrated in FIG. 3, the write latch circuit illustrated in FIG. 4, the intermediate latch circuit illustrated in FIG. 7B, and the output latch circuit illustrated in FIG. 8B.

As illustrated in FIGS. 9A and 9B, each of the first to eighth write control sub-circuits 101 to 108 in the write control circuit 100 may be implemented by a D flip-flop. In this case, the write control circuit 100 can be implemented as a ring counter composed of eight D flip-flops.

As illustrated in FIGS. 9A and 9B, each of the first to eighth write latch sub-circuits 201 to 208 in the write latch circuit 200 may be implemented by a D latch.

As illustrated in FIGS. 9A and 9B, each of the first to eighth intermediate latch sub-circuits 401 to 408 in the intermediate latch circuit 400 may be implemented by a D latch.

As illustrated in FIGS. 9A and 9B, each of the first to eighth output latch sub-circuits 501 to 508 in the output latch circuit 500 may be implemented by a D latch.

It should be noted that although the case where each write control sub-circuit in the write control circuit 100 is implemented by a D flip-flop, and each write latch sub-circuit in the write latch circuit 200, each intermediate latch sub-circuit in the intermediate latch circuit 400, and each output latch sub-circuit in the output latch circuit 500 are implemented by D latches is illustrated in FIG. 9A and FIG. 9B, but the embodiments of the present disclosure are obviously not limited thereto, each write control sub-circuit in the write control circuit 100, each write latch sub-circuit in the write latch circuit 200, each intermediate latch sub-circuit in the intermediate latch circuit 400, and each output latch sub-circuit in the output latch circuit 500 can also be implemented by SR latches, SR flip-flops, JK flip-flops, T flip-flops, etc., as long as the corresponding functions can be achieved.

For example, in the latch control circuit in the address latch provided by the embodiment of the present disclosure, each primary latch control sub-circuit in the primary latch control circuit may be a D latch, and each secondary latch control sub-circuit in the secondary latch control circuit may include an NOT gate, a transmission gate, and a transistor, a first terminal of the NOT gate is connected to a first control terminal of the transmission gate, the first terminal of the NOT gate is the control terminal of the corresponding secondary latch control sub-circuit, a second terminal of the NOT gate is connected to a second control terminal of the transmission gate and a gate electrode of the transistor, an input terminal of the transmission gate is the input terminal of the corresponding secondary latch control sub-circuit, and an output terminal of the transmission gate is connected to a first electrode of the transistor, the output terminal of the transmission gate is the output terminal of the corresponding secondary latch control sub-circuit, and a second electrode of the transistor is grounded.

Figure 10:
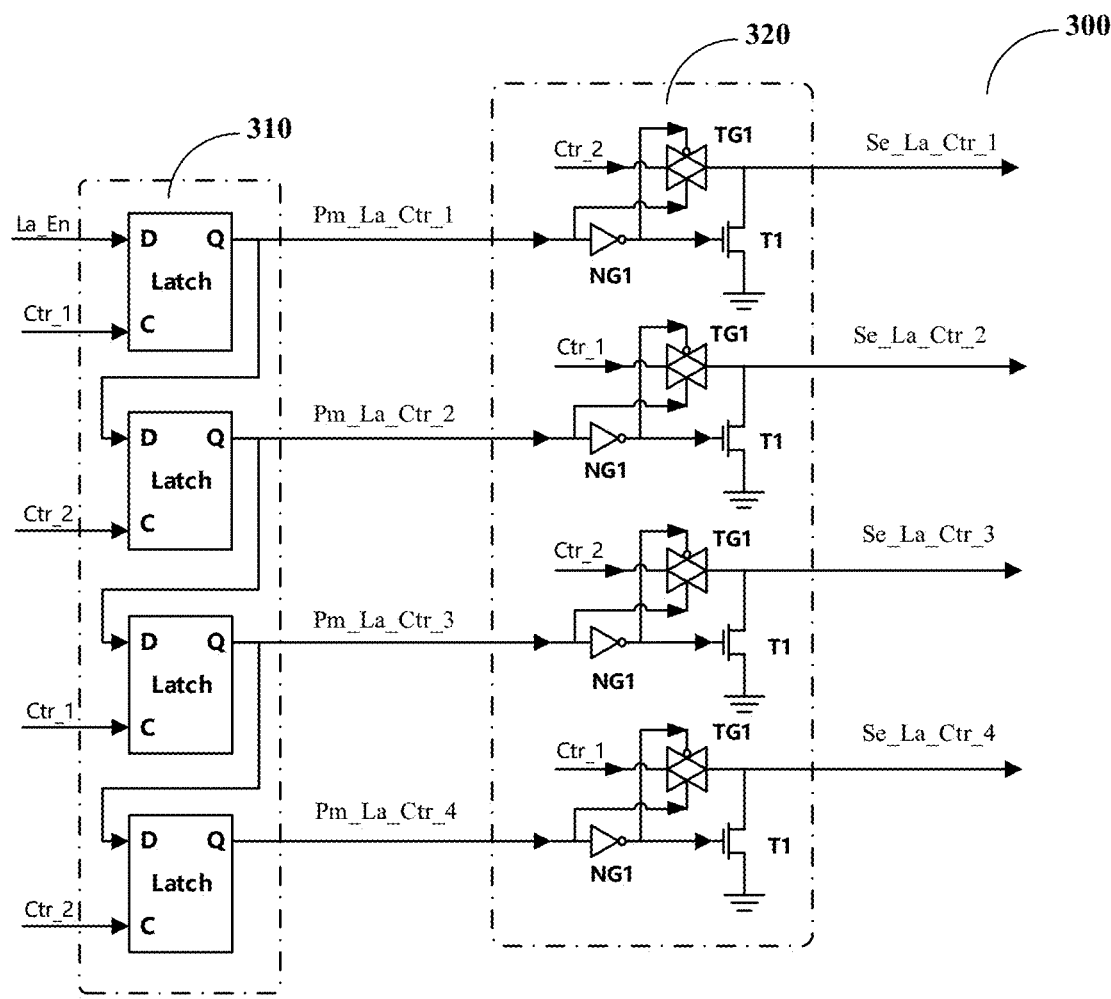
FIG. 10 is a structural diagram of a primary latch control circuit and a secondary latch control circuit in FIG. 6.

FIG. 10 is a structural diagram of the primary latch control circuit and the secondary latch control circuit in FIG. 6.

As illustrated in FIG. 10, each of the first to fourth primary latch control sub-circuits 311 to 314 in the primary latch control circuit 310 may be implemented by a D latch.

As illustrated in FIG. 10, each of the first to fourth secondary latch control sub-circuits 321 to 324 in the secondary latch control circuit 320 may include an NOT gate NG1, a transmission gate TG1, and a transistor T1, the NOT gate NG1 has a first terminal and a second terminal, the transmission gate TG1 has an input terminal, an output terminal, a first control terminal, and a second control terminal, and the transistor T1 has a gate electrode, a first electrode, and a second electrode. The first terminal of the NOT gate NG1 is connected to the first control terminal of the transmission gate TG1, the first terminal of the NOT gate NG1 is the control terminal of the corresponding secondary latch control sub-circuit, the second terminal of the NOT gate NG1 is connected to the second control terminal of the transmission gate TG and the gate electrode of the transistor T1, the input terminal of the transmission gate TG1 is the input terminal of the corresponding secondary latch control sub-circuit, the output terminal of the transmission gate TG1 is connected to the first electrode of the transistor T1, the output terminal of the transmission gate TG1 is the output terminal of the corresponding secondary latch control sub-circuit, and the second electrode of the transistor T1 is grounded.

It should be noted that although the case where each primary latch control sub-circuit in the primary latch control circuit 310 is implemented by a D latch is illustrated in FIG. 10, the embodiments of the present disclosure are obviously not limited thereto. Each of the primary latch control sub-circuits in the primary latch control circuit 310 can also be implemented by an SR latch, an SR flip-flop, a JK flip-flop, a T flip-flop, etc., as long as the corresponding function can be achieved.

Figure 11:
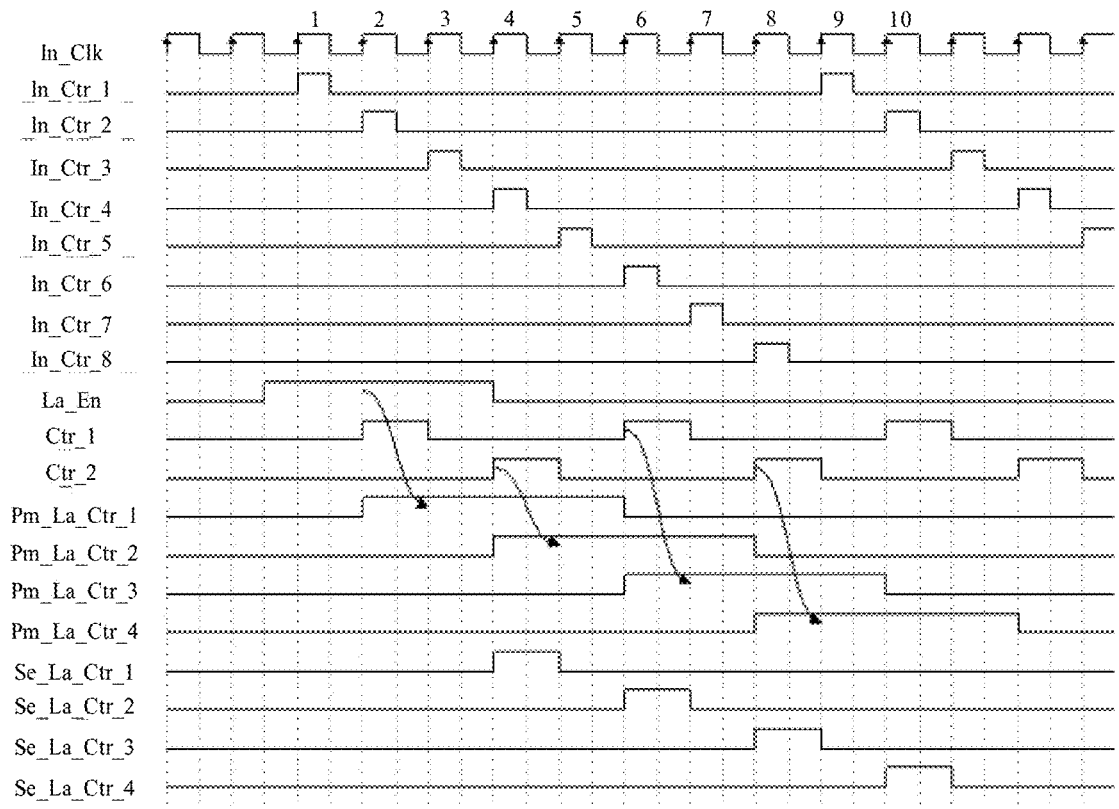
FIG. 11 is a signal timing diagram of an address latch according to an embodiment of the present disclosure.

FIG. 11 is a signal timing diagram of an address latch according to an embodiment of the present disclosure.

The operation principle of each circuit in the address latches illustrated in FIGS. 9A, 9B, and 10 will be described below with reference to FIG. 11. It should be noted that the level of each signal illustrated in FIG. 11 is only schematic, and does not represent a real level value.

As illustrated in FIGS. 9A, 9B, and 11, in the write control circuit 100, the first write control sub-circuit 101 generates the first write control signal In_Ctr_1 when the first rising edge of the write clock signal In_Clk arrives, the second write control sub-circuit 102 generates the second write control signal In_Ctr_2 when the second rising edge of the write clock signal In_Clk arrives, the third write control sub-circuit 103 generates the third write control signal In_Ctr_3 when the third rising edge of the write clock signal In_Clk arrives, the fourth write control sub-circuit 104 generates the fourth write control signal In_Ctr_4 when the fourth rising edge of the write clock signal In_Clk arrives, the fifth write control sub-circuit 105 generates the fifth write control signal In_Ctr_5 when the fifth rising edge of the write clock signal In_Clk arrives, the sixth write control sub-circuit 106 generates the sixth write control signal In_Ctr_6 when the sixth rising edge of the write clock signal In_Clk arrives, the seventh write control sub-circuit 107 generates the seventh write control signal In_Ctr_7 when the seventh rising edge of the write clock signal In_Clk arrives, and the eighth write control sub-circuit 108 generates the eighth write control signal In_Ctr_ when the eighth rising edge of the write clock signal In_Clk arrives.

As illustrated in FIG. 11, the first write control signal In_Ctr_1 is at a high level within half a clock cycle after the first rising edge of the write clock signal In_Clk arrives, the second write control signal In_Ctr_2 is at a high level within half a clock cycle after the second rising edge of the write clock signal In_Clk arrives, the third write control signal In_Ctr_3 is at a high level within half a clock cycle after the third rising edge of the write clock signal In_Clk arrives, the fourth write control signal In_Ctr_4 is at a high level within half a clock cycle after the fourth rising edge of the write clock signal In_Clk arrives, the fifth write control signal In_Ctr_5 is at a high level within half a clock cycle after the fifth rising edge of the write clock signal In_Clk arrives, the sixth write control signal In_Ctr_6 is at a high level within half a clock cycle after the sixth rising edge of the write clock signal In_Clk arrives, the seventh write control signal In_Ctr_7 is at a high level within half a clock cycle after the seventh rising edge of the write clock signal In_Clk arrives, and the eighth write control signal In_Ctr_8 is at a high level within half a clock cycle after the eighth rising edge of the write clock signal In_Clk arrives.

As illustrated in FIGS. 9A, 9B, and 11, in the write latch circuit 200, the first write latch sub-circuit 201 latches the first data bit Add_Da_1 of the address data in response to the first write control signal In_Ctr_1 that is at a high level, the second write latch sub-circuit 202 latches the second data bit Add_Da_2 of the address data in response to the second write control signal In_Ctr_2 that is at a high level, the third write latch sub-circuit 203 latches the third data bit Add_Da_3 of the address data in response to the third write control signal In_Ctr_3 that is at a high level, the fourth write latch sub-circuit 204 latches the fourth data bit Add_Da_4 of the address data in response to the fourth write control signal In_Ctr_4 that is at a high level, the fifth write latch sub-circuit 205 latches the fifth data bit Add_Da_5 of the address data in response to the fifth write control signal In_Ctr_5 that is at a high level, the sixth write latch sub-circuit 206 latches the sixth data bit Add_Da_6 of the address data in response to the sixth write control signal In_Ctr_6 that is at a high level, the seventh write latch sub-circuit 207 latches the seventh data bit Add_Da_7 of the address data in response to the seventh write control signal In_Ctr_7 that is at a high level, and the eighth write latch sub-circuit 208 latches the eighth data bit Add_Da_8 of the address data in response to the eighth write control signal In_Ctr_8 that is at a high level.

As illustrated in FIGS. 10 and 11, in the primary latch control circuit 310, the first primary latch control sub-circuit 311 generates the first primary latch control signal Pm_La_Ctr_1 based on the latch enable signal La_En that is at a high level and the first control signal Ctr_1 that is at a high level, the second primary latch control sub-circuit 312 generates the second primary latch control signal Pm_La_Ctr_2 based on the second control signal Ctr_2 that is at a high level and the first primary latch control signal Pm_La_Ctr_1 that is at a high level, the third primary latch control sub-circuit 313 generates the third primary latch control signal Pm_La_Ctr_3 based on the first control signal Ctr_1 that is at a high level and the second primary latch control signal Pm_La_Ctr_2 that is at a high level, and the fourth primary latch control sub-circuit 314 generates the fourth primary latch control signal Pm_La_Ctr_4 based on the second control signal Ctr_2 that is at a high level and the third primary latch control signal Pm_La_Ctr_3 that is at a high level.

As illustrated in FIG. 11, the first control signal Ctr_1 and the second control signal Ctr_2 are alternately at a high level. For example, the first control signal Ctr_1 is at a high level within one clock cycle after the second rising edge of the write clock signal In_Clk arrives and within one clock cycle after the sixth rising edge of the write clock signal In_Clk arrives, and the second control signal Ctr_2 is at a high level within one clock cycle after the fourth rising edge of the write clock signal In_Clk arrives and within one clock cycle after the eighth rising edge of the write clock signal In_Clk arrives. As illustrated in FIG. 11, the first primary latch control signal Pm_La_Ctr_1 is at a high level within four clock cycles after the second rising edge of the write clock signal In_Clk arrives, the second primary latch control signal Pm_La_Ctr_2 is at a high level within four clock cycles after the fourth rising edge of the write clock signal In_Clk arrives, the third primary latch control signal Pm_La_Ctr_3 is at a high level within four clock cycles after the sixth rising edge of the write clock signal In_Clk arrives, and the fourth primary latch control signal Pm_La_Ctr_4 is at a high level within four clock cycles after the eighth rising edge of the write clock signal In_Clk arrives.

As illustrated in FIGS. 10 and 11, in the secondary latch control circuit 320, the first secondary latch control sub-circuit 321 generates the first secondary latch control signal Se_La_Ctr_1 based on the second control signal Ctr_2 that is at a high level and the first primary latch control signal Pm_La_Ctr_1 that is at a high level, the second secondary latch control sub-circuit 322 generates the second secondary latch control signal Se_La_Ctr_2 based on the first control signal Ctr_1 that is at a high level and the second primary latch control signal Pm_La_Ctr_2 that is at a high level, the third secondary latch control sub-circuit 323 generates the third secondary latch control signal Se_La_Ctr_3 based on the second control signal Ctr_2 that is at a high level and the third primary latch control signal Pm_La_Ctr_3 that is at a high level, and the fourth secondary latch control sub-circuit 324 generates the fourth secondary latch control signal Se_La_Ctr_4 based on the first control signal Ctr_1 that is at a high level and the fourth primary latch control signal Pm_La_Ctr_4 that is at a high level.

As illustrated in FIG. 11, the first secondary latch control signal Se_La_Ctr_1 is at a high level within one clock cycle after the fourth rising edge of the write clock signal In_Clk arrives, the second secondary latch control signal Se_La_Ctr_2 is at a high level within one clock cycle after the sixth rising edge of the write clock signal In_Clk arrives, the third secondary latch control signal Se_La_Ctr_3 is at a high level within one clock cycle after the eighth rising edge of the write clock signal In_Clk arrives, and the fourth secondary latch control signal Se_La_Ctr_4 is at a high level within one clock cycle after the tenth rising edge of the write clock signal In_Clk arrives.

As illustrated in FIGS. 9A, 9B, 10, and 11, in a case where the first secondary latch control signal Se_La_Ctr_1 is at a high level, the write latch circuit 200 has already latched the first data bit Add_Da_1, the second data bit Add_Da_2, the third data bit Add_Da_3, and the fourth data bit Add_Da_4 of the address data; in a case where the second secondary latch control signal Se_La_Ctr_2 is at a high level, the write latch circuit 200 has already latched the first data bit Add_Da_1, the second data bit Add_Da_2, the third data bit Add_Da_3, the fourth data bit Add_Da_4, the fifth data bit Add_Da_5, and the sixth data bit Add_Da_6 of the address data; in a case where the third secondary latch control signal Se_La_Ctr_3 is at a high level, the write latch circuit 200 has already latched the first data bit Add_Da_1, the second data bit Add_Da_2, the third data bit Add_Da_3, the fourth data bit Add_Da_4, the fifth data bit Add_Da_5, the sixth data bit Add_Da_6, the seventh data bits Add_Da_7, and the eighth data bit Add_Da_8 of the address data. After the write latch circuit 200 has latched all the data bits of the address data Add_Da, the write latch circuit 200 restarts latching the data bits of the next address data Add_Da.

As illustrated in FIGS. 9A and 11, the first intermediate latch sub-circuit 401, the second intermediate latch sub-circuit 402, the third intermediate latch sub-circuit 403, and the fourth intermediate latch sub-circuit 404 in the intermediate latch circuit 400 respectively latch, in response to the first latch control signal La_Ctr_1 at a high level, the first data bit Add_Da_1, the second data bit Add_Da_2, the third data bit Add_Da_3, and the fourth data bit Add_Da_4 of the address data latched by the write latch circuit 200 at the first moment; and the fifth intermediate latch sub-circuit 405, the sixth intermediate latch sub-circuit 406, the seventh intermediate latch sub-circuit 407, and the eighth intermediate latch sub-circuit 408 in the intermediate latch circuit 400 respectively latch, in response to the second latch control signal La_Ctr_2 at a high level, the fifth data bit Add_Da_5, the sixth data bit Add_Da_6, the seventh data bit Add_Da_7 and the eighth data bit Add_Da_8 of the address data latched by the write latch circuit 200 at the second moment. Here, the first moment is a moment when the first latch control signal La_Ctr_1 is at a high level, and the second moment is a moment when the second latch control signal La_Ctr_2 is at a high level. In addition, according to the foregoing description made with reference to FIGS. 6 and 7A, it can be known that the first latch control signal La_Ctr_1 herein may be the first secondary latch control signal Se_La_Ctr_1 or the second secondary latch control signal Se_La_Ctr_2, and the second latch control signal La_Ctr_2 may be the third secondary latch control signal Se_La_Ctr_3.

As illustrated in FIGS. 9A and 11, the first to eighth output latch sub-circuits 501 to 508 in the output latch circuit 500 respectively output, in response to the third latch control signal La_Ctr_3 at a high level, the first data bit Add_Da_1, the second data bit Add_Da_2, the third data bit Add_Da_3, the fourth data bit Add_Da_4, the fifth data bit Add_Da_5, the sixth data bit Add_Da_6, the seventh data bit Add_Da_7, and the eighth data bit Add_Da_8 of the address data latched by the intermediate latch circuit 400 from the address latch at the third moment. Here, the third moment refers to a moment when the third latch control signal La_Ctr_3 is at a high level. In addition, according to the foregoing description made with reference to FIGS. 6 and 7A, it can be known that the third latch control signal La_Ctr_3 herein may be the fourth secondary latch control signal Se_La_Ctr_4.

As illustrated in FIGS. 9A and 11, in a case where the first latch control signal La_Ctr_1 is the first secondary latch control signal Se_La_Ctr_1, the first latch control signal La_Ctr_1 may have a delay of five clock cycles, that is, the first latch control signal La_Ctr_1 can be transmitted from the latch control circuit 300 to the intermediate latch circuit 400 after the fourth rising edge of the write clock signal In_Clk arrives and before the ninth rising edge of the write clock signal In_Clk arrives. During this period, the write latch circuit 200 has already latched the first data bit Add_Da_1, the second data bit Add_Da_2, the third data bit Add_Da_3, and the fourth data bit Add_Da_4 of the address data, but has not yet begun to latch the first data bit Add_Da_1, the second data bit Add_Da_2, the third data bit Add_Da_3, or the fourth data bit Add_Da_4 of the next address data. Thus, even if the first latch control signal La_Ctr_1 is delayed by one to five clock cycles, the first intermediate latch sub-circuit 401, the second intermediate latch sub-circuit 402, the third intermediate latch sub-circuit 403, and the fourth intermediate latch sub-circuit 404 in the intermediate latch circuit 400 can accurately latch the first data bit Add_Da_1, the second data bit Add_Da_2, the third data bit Add_Da_3, and the fourth data bit Add_Da_4 of the address data, respectively.

As illustrated in FIGS. 9A and 11, in a case where the first latch control signal La_Ctr_1 is the second secondary latch control signal Se_La_Ctr_2, the first latch control signal La_Ctr_1 may have a delay of three clock cycles, that is, the first latch control signal La_Ctr_1 can be transmitted from the latch control circuit 300 to the intermediate latch circuit 400 after the sixth rising edge of the write clock signal In_Clk arrives and before the ninth rising edge of the write clock signal In_Clk arrives. During this period, the write latch circuit 200 has already latched the first data bit Add_Da_1, the second data bit Add_Da_2, the third data bit Add_Da_3, and the fourth data bit Add_Da_4 of the address data, but has not yet begun to latch the first data bit Add_Da_1, the second data bit Add_Da_2, the third data bit Add_Da_3, or the fourth data bit Add_Da_4 of the next address data. Thus, even if the first latch control signal La_Ctr_1 is delayed by one to three clock cycles, the first intermediate latch sub-circuit 401, the second intermediate latch sub-circuit 402, the third intermediate latch sub-circuit 403, and the fourth intermediate latch sub-circuit 404 in the intermediate latch circuit 400 can accurately latch the first data bit Add_Da_1, the second data bit Add_Da_2, the third data bit Add_Da_3, and the fourth data bit Add_Da_4 of the address data, respectively.

As illustrated in FIGS. 9A and 11, in a case where the second latch control signal La_Ctr_2 is the third secondary latch control signal Se_La_Ctr_3, the second latch control signal La_Ctr_2 may have a delay of five clock cycles, that is, the second latch control signal La_Ctr_2 can be transmitted from the latch control circuit 300 to the intermediate latch circuit 400 after the eighth rising edge of the write clock signal In_Clk arrives and before the thirteenth rising edge of the write clock signal In_Clk arrives. During this period, the write latch circuit 200 has already latched the fifth data bit Add_Da_5, the sixth data bit Add_Da_6, the seventh data bit Add_Da_7, and the eighth data bit Add_Da_8 of the address data, but has not yet begun to latch the fifth data bit Add_Da_5, the sixth data bit Add_Da_6, the seventh data bit Add_Da_7, or the eighth data bit Add_Da_8 of the next address data. Thus, even if the second latch control signal La_Ctr_2 is delayed by one to five clock cycles, the fifth intermediate latch sub-circuit 405, the sixth intermediate latch sub-circuit 406, the seventh intermediate latch sub-circuit 407, and the eighth intermediate latch sub-circuit 408 in the intermediate latch circuit 400 can accurately latch the fifth data bit Add_Da_5, the sixth data bit Add_Da_6, the seventh data bit Add_Da_7, and the eighth data bit Add_Da_8 of the address data, respectively.

As illustrated in FIGS. 9A and 11, in a case where the third latch control signal La_Ctr_3 is the fourth secondary latch control signal Se_La_Ctr_4, if the first latch control signal La_Ctr_1 is the first secondary latch control signal Se_La_Ctr_1, the third latch control signal La_Ctr_3 can have a delay of two clock cycles, that is, the third latch control signal La_Ctr_3 can be transmitted from the latch control circuit 300 to the output latch circuit 500 after the tenth rising edge of the write clock signal In_Clk arrives and before the twelfth rising edge of the write clock signal In_Clk arrives. During this period, the intermediate latch circuit 400 has already latched the first data bit Add_Da_1, the second data bit Add_Da_2, the third data bit Add_Da_3, the fourth data bit Add_Da_4, the fifth data bit Add_Da_5, the sixth data bit Add_Da_6, the seventh data bit Add_Da_7, and the eighth data bit Add_Da_8 of the address data, but has not yet begun to latch the next address data. In this case, even if the third latch control signal La_Ctr_3 is delayed by one to two clock cycles, the first output latch sub-circuit 501, the second output latch sub-circuit 502, the third output latch sub-circuit 503, the fourth output latch sub-circuit 504, the fifth output latch sub-circuit 505, the sixth output latch sub-circuit 506, the seventh output latch sub-circuit 507, and the eighth output latch sub-circuit 508 in the output latch circuit 500 503 can accurately output the first data bit Add_Da_1, the second data bit Add_Da_2, the third data bit Add_Da_3, the fourth data bit Add_Da_4, the fifth data bit Add_Da_5, the sixth data bit Add_Da_6, the seventh data bit Add_Da_7, and the eighth data Bit Add_Da_8 of the address data from the address latch.

As illustrated in FIGS. 9A and 11, in a case where the third latch control signal La_Ctr_3 is the fourth secondary latch control signal Se_La_Ctr_4, if the first latch control signal La_Ctr_1 is the second secondary latch control signal Se_La_Ctr_2, the third latch control signal La_Ctr_3 can have a delay of four clock cycles, that is, the third latch control signal La_Ctr_3 can be transmitted from the latch control circuit 300 to the output latch circuit 500 after the tenth rising edge of the write clock signal In_Clk arrives and before the fourteenth rising edge of the write clock signal In_Clk arrives. In this case, even if the third latch control signal La_Ctr_3 is delayed by one to four clock cycles, the first output latch sub-circuit 501, the second output latch sub-circuit 502, the third output latch sub-circuit 503, the fourth output latch sub-circuit 504, the fifth output latch sub-circuit 505, the sixth output latch sub-circuit 506, the seventh output latch sub-circuit 507, and the eighth output latch sub-circuit 508 in the output latch circuit 500 can accurately output the first data bit Add_Da_1, the second data bit Add_Da_2, the third data bit Add_Da_3, the fourth data bit Add_Da_4, the fifth data bit Add_Da_5, the sixth data bit Add_Da_6, and the seventh data bit Add_Da_7, and the eighth data bit Add_Da_8 of the address data from the address latch.

As illustrated in FIGS. 9B and 11, the first intermediate latch sub-circuit 401, the second intermediate latch sub-circuit 402, and the third intermediate latch sub-circuit 403 in the intermediate latch circuit 400 respectively latch, in response to the first latch control signal La_Ctr_1 at a high level, the first data bit Add_Da_1, the second data bit Add_Da_2, and the third data bit Add_Da_3 of the address data latched by the write latch circuit 200 at the first moment; the fourth intermediate latch sub-circuit 404, the fifth intermediate latch sub-circuit 405, and the sixth intermediate latch sub-circuit 406 in the intermediate latch circuit 400 respectively latch, in response to the second latch control signal La_Ctr_2 at a high level, the fourth data bit Add_Da_4, the fifth data bit Add_Da_5, and the sixth data bit Add_Da_6 of the address data latched by the write latch circuit 200 at the second moment; and the seventh intermediate latch sub-circuit 407 and the eighth intermediate latch sub-circuit 408 in the intermediate latch circuit 400 respectively latch, in response to the third latch control signal La_Ctr_3 at a high level, the seventh data bit Add_Da_7 and the eighth data bit Add_Da_8 of the address data latched by the write latch circuit 200 at the third moment. Here, the first moment refers to a moment when the first latch control signal La_Ctr_1 is at a high level, the second moment refers to a moment when the second latch control signal La_Ctr_2 is at a high level, and the third moment refers to a moment when the third latch control signal La_Ctr_3 is at a high level. In addition, according to the forgoing description made with reference to FIGS. 6 and 7B, it can be known that the first latch control signal La_Ctr_1 herein may be the first secondary latch control signal Se_La_Ctr_1, the second latch control signal La_Ctr_2 herein may be the second secondary latch control signal Se_La_Ctr_2, and the third latch control signal La_Ctr_3 herein may be the third secondary latch control signal Se_La_Ctr_3.

As illustrated in FIGS. 9B and 11, the first to eighth output latch sub-circuits 501 to 508 in the output latch circuit 500 respectively output, in response to the fourth latch control signal La_Ctr_4 at a high level, the first data bit Add_Da_1 to the eighth data bit Add_Da_8 of the address data latched by the intermediate latch circuit 400 from the address latch at the fourth moment. Here, the fourth moment refers to a moment when the fourth latch control signal La_Ctr_4 is at a high level. In addition, according to the foregoing description made with reference to FIGS. 6 and 7B, it can be known that the fourth latch control signal La_Ctr_4 herein may be the fourth secondary latch control signal Se_La_Ctr_4.

As illustrated in FIGS. 9B and 11, in a case where the first latch control signal La_Ctr_1 is the first secondary latch control signal Se_La_Ctr_1, the first latch control signal La_Ctr_1 may have a delay of five clock cycles, that is, the first latch control signal La_Ctr_1 can be transmitted from the latch control circuit 300 to the intermediate latch circuit 400 after the fourth rising edge of the write clock signal In_Clk arrives and before the ninth rising edge of the write clock signal In_Clk arrives. In this case, even if the first latch control signal La_Ctr_1 is delayed by one to five clock cycles, the first intermediate latch sub-circuit 401, the second intermediate latch sub-circuit 402, and the third intermediate latch sub-circuit 403 in the intermediate latch circuit 400 can accurately latch the first data bit Add_Da_1, the second data bit Add_Da_2, and the third data bit Add_Da_3 of the address data, respectively.

As illustrated in FIG. 9B and FIG. 11, in a case where the second latch control signal La_Ctr_2 is the second secondary latch control signal Se_La_Ctr_2, the second latch control signal La_Ctr_2 may have a delay of six clock cycles, that is, the second latch control signal La_Ctr_2 can be transmitted from the latch control circuit 300 to the intermediate latch circuit 400 after the sixth rising edge of the write clock signal In_Clk arrives and before the twelfth rising edge of the write clock signal In_Clk arrives. In this case, even if the second latch control signal La_Ctr_2 is delayed by one to six clock cycles, the fourth intermediate latch sub-circuit 404, the fifth intermediate latch sub-circuit 405, and the sixth intermediate latch sub-circuit 406 in the intermediate latch circuit 400 can accurately latch the fourth data bit Add_Da_4, the fifth data bit Add_Da_5, and the sixth data bit Add_Da_6 of the address data, respectively.

As illustrated in FIG. 9B and FIG. 11, in a case where the third latch control signal La_Ctr_3 is the third secondary latch control signal Se_La_Ctr_3, the third latch control signal La_Ctr_3 may have a delay of seven clock cycles, that is, the third latch control signal La_Ctr_3 can be transmitted from the latch control circuit 300 to the intermediate latch circuit 400 after the eighth rising edge of the write clock signal In_Clk arrives and before the fifteenth rising edge of the write clock signal In_Clk arrives. In this case, even if the third latch control signal La_Ctr_3 is delayed by one to seven clock cycles, the seventh intermediate latch sub-circuit 407 and the eighth intermediate latch sub-circuit 408 in the intermediate latch circuit 400 can accurately latch the seventh data bit Add_Da_7 and the eighth data bit Add_Da_8 of the address data, respectively.

As illustrated in FIG. 9B and FIG. 11, in a case where the fourth latch control signal La_Ctr_4 is the fourth secondary latch control signal Se_La_Ctr_4, the fourth latch control signal La_Ctr_4 may have a delay of two clock cycles, that is, the fourth latch control signal La_Ctr_4 can be transmitted from the latch control circuit 300 to the output latch circuit 500 after the tenth rising edge of the write clock signal In_Clk arrives and before the twelfth rising edge of the write clock signal In_Clk arrives. In this case, even if the fourth latch control signal La_Ctr_4 is delayed by one to two clock cycles, the first output latch sub-circuit 501, the second output latch sub-circuit 502, the third output latch sub-circuit 503, the fourth output latch sub-circuit 504, the fifth output latch sub-circuit 505, the sixth output latch sub-circuit 506, the seventh output latch sub-circuit 507, and the eighth output latch sub-circuit 508 in the output latch circuit 500 can accurately output the first data bit Add_Da_1, the second data bit Add_Da_2, the third data bit Add_Da_3, the fourth data bit Add_Da_4, the fifth data bit Add_Da_5, the sixth data bit Add_Da_6, the seventh data bit Add_Da_7, and the eighth data bit Add_Da_8 of the address data from the address latch.

At least one embodiment of the present disclosure also provides a display device. The display device includes an address latch provided by any one of the foregoing embodiments of the present disclosure and a gate driver, and the gate driver is configured to generate a scan signal corresponding to the address data in response to the address data output from the address latch.

Figure 12:
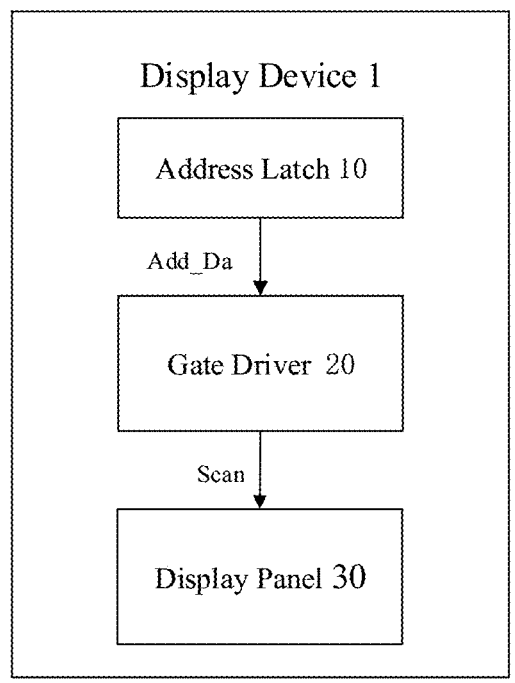
FIG. 12 is a block diagram of a display device according to an embodiment of the present disclosure.

FIG. 12 is a block diagram of a display device according to an embodiment of the present disclosure.

As illustrated in FIG. 12, the display device 1 may include an address latch 10 provided by any one of the foregoing embodiments of the present disclosure and a gate driver 20. The gate driver 20 is connected to the address latch 10 and is configured to generate a scan signal Scan corresponding to the address data Add_Da in response to the address data Add_Da output from the address latch 10.

In addition, as illustrated in FIG. 12, the display device 1 may further include other components such as a display panel 30. The display panel 30 includes a plurality of pixel units arranged in a plurality of rows and columns, and the plurality of rows of pixel units are respectively connected to a plurality of gate lines. The plurality of gate lines are also connected to the gate driver 20, and the gate driver 20 sequentially outputs the scan signals Scan to the plurality of gate lines, so that progressive or interlaced scanning can be performed on the plurality of pixel units in the display panel 30, so as to display an image.

For example, the display device 1 may be a display device based on a MIP (Memory-in-Pixel) technology. The display device 1 may include any product or component having a display function, such as a liquid crystal television, an OLED television, a mobile phone, a tablet computer, a notebook computer, a digital camera, a navigator, and the like.

For specific technical effects of the display device provided by the embodiments of the present disclosure, reference may be made to the corresponding description of the address latch in the foregoing embodiments of the present disclosure, and details are not described herein again.

For example, in the display device provided by an embodiment of the present disclosure, the gate driver may include a plurality of cascaded shift register units.

Figure 13:
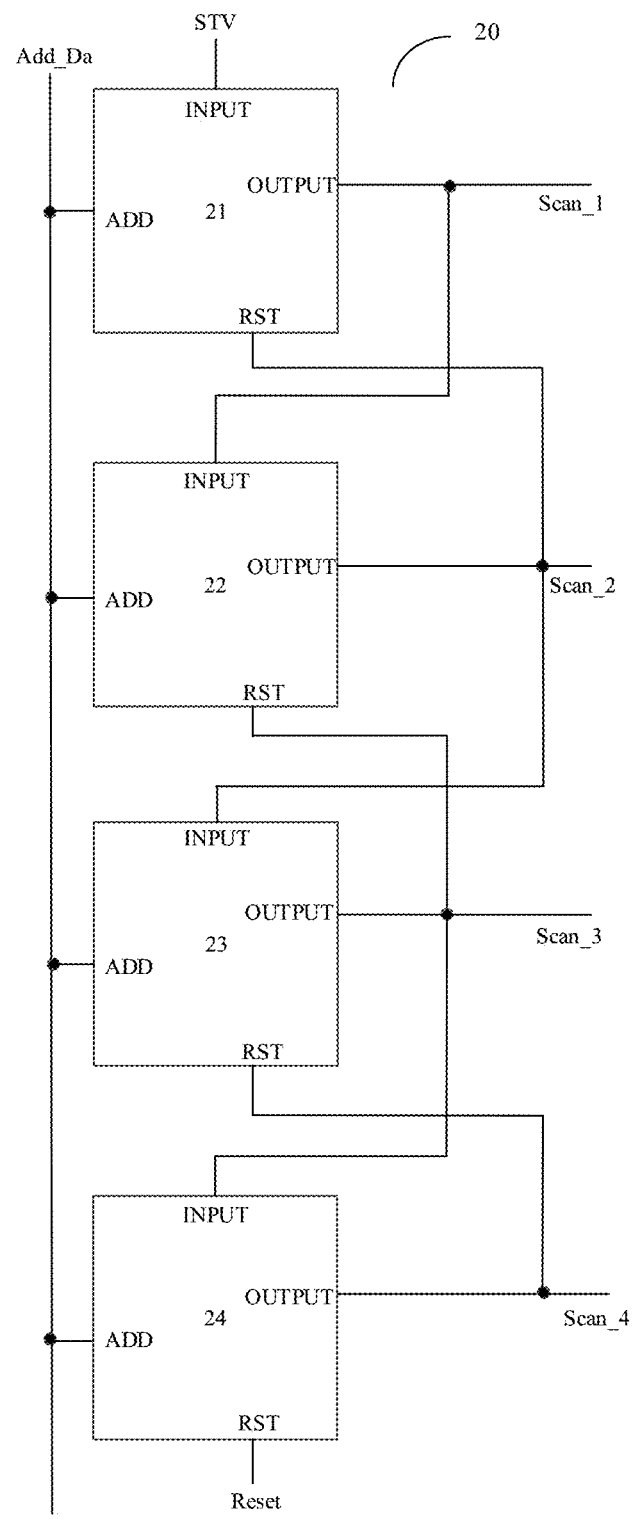
FIG. 13 is a schematic diagram of a gate driver in the display device of FIG. 12.

FIG. 13 is a schematic diagram of the gate driver in the display device of FIG. 12. FIG. 13 illustrates a case where the gate driver 20 includes four shift register units.

As illustrated in FIG. 13, the gate driver 20 includes a first shift register unit 21, a second shift register unit 22, a third shift register unit 23, and a fourth shift register unit 24.

As illustrated in FIG. 13, each shift register unit in the gate driver 20 may have an input signal terminal INPUT, an address signal terminal ADD, an output signal terminal OUTPUT, and a reset signal terminal RST.

As illustrated in FIG. 13, except for the last shift register unit (e.g., the fourth shift register unit 24), the reset signal terminal RST of each of the other shift register units is connected to the signal output terminal OUTPUT of the next shift register unit. Except for the first shift register unit (e.g., the first shift register unit 21), the input signal terminal INPUT of each of the other shift register units is connected to the signal output terminal OUTPUT of the previous shift register unit. The input signal terminal INPUT of the first shift register unit may be configured to receive a trigger signal STV, and the reset signal terminal RST of the last shift register unit may be configured to receive a reset signal Reset.

As illustrated in FIG. 13, the address signal terminal ADD of each shift register unit in the gate driver 20 may be connected to the address latch to receive the address data Add_Da. The output signal terminal OUTPUT of the first shift register unit 21 can output a first row scan signal Scan_1, the output signal terminal OUTPUT of the second shift register unit 22 can output a second row scan signal Scan_2, the output signal terminal OUTPUT of the third shift register unit 23 can output a third row scan signal Scan_3, and the output signal terminal OUTPUT of the fourth shift register unit 24 can output a fourth row scan signal Scan_4.

It should be noted that although the case where the gate driver includes four shift register units is illustrated in FIG. 13, the embodiments of the present disclosure are obviously not limited thereto, and the number of shift register units included in the gate driver can be determined according to actual needs.

Figure 14:
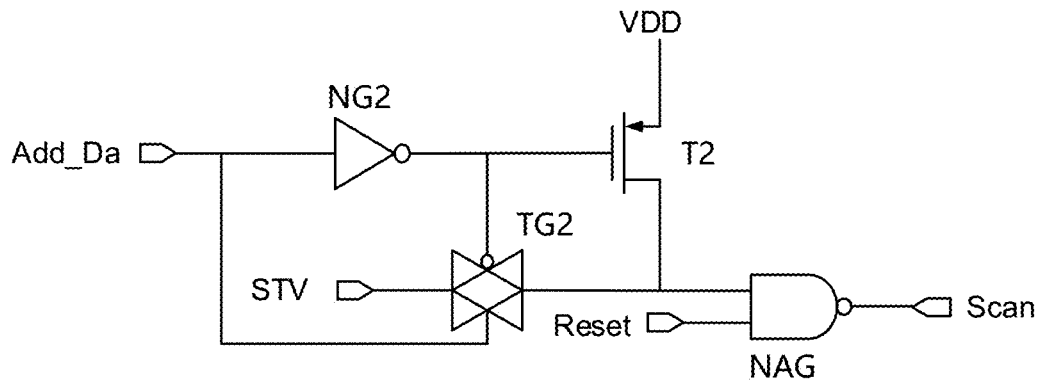
FIG. 14 is a structural diagram of a shift register unit in the gate driver of FIG. 13.

FIG. 14 is a structural diagram of the shift register unit in the gate driver of FIG. 13.

As illustrated in FIG. 14, the shift register unit includes a NOT gate NG, a transmission gate TG, a NAND gate NAG, and a transistor T. The NOT gate NG has a first terminal and a second terminal, the transmission gate TG has an input terminal, an output terminal, a first control terminal, and a second control terminal, the NAND gate NAG has a first input terminal, a second input terminal, and an output terminal, and the transistor T has a gate electrode, a first electrode, and a second electrode.

As illustrated in FIG. 14, the first terminal of the NOT gate NG and the first control terminal of the transmission gate TG are connected together and serve as the address signal terminal ADD of the corresponding shift register unit to receive the address data Add_Da output from the address latch. The second terminal of the NOT gate NG is connected to the second control terminal of the transmission gate TG and the gate electrode of the transistor T. The input terminal of the transmission gate TG is used as the input signal terminal INPUT of the corresponding shift register unit to receive the trigger signal STV, and the output terminal of the transmission gate TG is connected to the second electrode of the transistor T and the first input terminal of the NAND gate NAG. The second input terminal of the NAND gate NAG is used as the reset signal terminal RST of the corresponding shift register unit to receive the reset signal Reset. The output terminal of the NAND gate NAG is used as the output signal terminal OUTPUT of the corresponding shift register unit to output the scan signal Scan. The first electrode of the transistor T is connected to the power source to receive a power source voltage VDD.

At least one embodiment of the present disclosure also provides an address latching method using the address latch provided by any one of the foregoing embodiments of the present disclosure.

Figure 15:
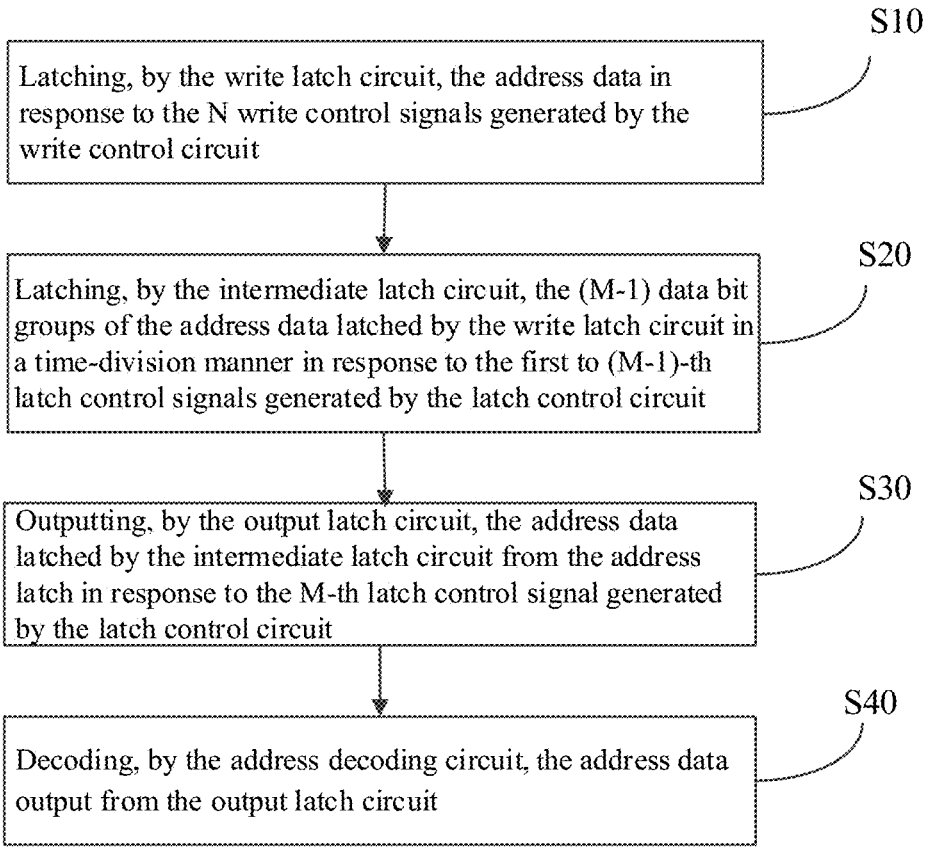
FIG. 15 is a flowchart of an address latching method according to an embodiment of the present disclosure.

FIG. 15 is a flowchart of an address latching method according to an embodiment of the present disclosure.

As illustrated in FIG. 15, the address latching method may include the following steps:

S10: in a write latch phase, latching, by the write latch circuit, the address data in response to the N write control signals generated by the write control circuit;

S20: in an intermediate latch phase, latching, by the intermediate latch circuit, the (M−1) data bit groups of the address data latched by the write latch circuit in a time-division manner in response to the first to (M−1)-th latch control signals generated by the latch control circuit;

S30: in an output latch phase, outputting, by the output latch circuit, the address data latched by the intermediate latch circuit from the address latch in response to the M-th latch control signal generated by the latch control circuit.

For example, in the address latching method provided by the embodiment of the present disclosure, the write latch phase and the intermediate latch phase may overlap in time, that is, before the write latch circuit has latched all the data bits of the address data, the intermediate latch circuit can start to latch some data bits, which have been latched by the write latch circuit, of the address data.

Referring back to FIG. 9A and FIG. 11, taking the case where the first latch control signal La_Ctr_1 is the second secondary latch control signal Se_La_Ctr_2 as an example, in a case where the first latch control signal La_Ctr_1 is at a high level, the write latch circuit 200 has latched the first data bit Add_Da_1, the second data bit Add_Da_2, the third data bit Add_Da_3, the fourth data bit Add_Da_4, the fifth data bit Add_Da_5, and the sixth data bit Add_Da_6 of the address data. However, at this time, the intermediate latch circuit 400 may latch the first data bit Add_Da_1, the second data bit Add_Da_2, the third data bit Add_Da_3, and the fourth data bit Add_Da_4, which have been latched by the write latch circuit 200, of the address data in response to the first latch control signal La_Ctr_1 that is at the high level.

Referring back to FIGS. 9B and 11, taking the case where the first latch control signal La_Ctr_1 is the first secondary latch control signal Se_La_Ctr_1 as an example, in a case where the first latch control signal La_Ctr_1 is at a high level, the write latch circuit 200 has latched the first data bit Add_Da_1, the second data bit Add_Da_2, the third data bit Add_Da_3, and the fourth data bit Add_Da_4 of the address data. However, at this time, the intermediate latch circuit 400 may latch the first data bit Add_Da_1, the second data bit Add_Da_2, and the third data bit Add_Da_3, which have been latched by the write latch circuit 200, of the address data in response to the first latch control signal La_Ctr_1 that is at the high level.

It should be noted that when the intermediate latch circuit 400 starts to latch the address data, the data bits of the address data latched by the intermediate latch circuit 400 should be one or more of the data bits of the address data that have been latched by the write latch circuit 200.

In addition, as illustrated in FIG. 15, the address latching method provided by the embodiment of the present disclosure may further include:

S40: in an address decoding phase, decoding, by the address decoding circuit, the address data output from the output latch circuit.

For detailed descriptions and technical effects of the address latching method provided by the embodiments of the present disclosure, reference may be made to the corresponding descriptions of the address latch in the foregoing embodiments of the present disclosure, and details are not repeated here.

For the present disclosure, the following statements should be noted:

(1) The accompanying drawings involve only the structure(s) in connection with the embodiment(s) of the present disclosure, and other structure(s) can be referred to common design(s).

(2) In case of no conflict, features in one embodiment or in different embodiments can be combined.

What are described above is only specific implementation of the present disclosure, however, the protection scope of the present disclosure is not limited thereto, and the protection scope of the present disclosure are defined by the protection scope of the accompanying claims.

What is claimed is:

1. An address latch, comprising: a write control circuit, a write latch circuit, a latch control circuit, an intermediate latch circuit, and an output latch circuit, wherein
   the write control circuit is configured to generate N write control signals, and N is a positive integer greater than or equal to 2;
   the write latch circuit is connected to the write control circuit, and is configured to latch an address data that is received in response to the N write control signals, the address data comprises N data bits, and the N data bits are divided into (M−1) data bit groups;
   the latch control circuit is configured to sequentially generate M latch control signals, and M is a positive integer greater than or equal to 3;
   the intermediate latch circuit is connected to the write latch circuit and the latch control circuit, and is configured to sequentially latch, in response to first to (M−1)-th latch control signals of the M latch control signals, the (M−1) data bit groups of the address data latched by the write latch circuit in a time-division manner;
   the output latch circuit is connected to the intermediate latch circuit and the latch control circuit, and is configured to output the address data latched by the intermediate latch circuit from the address latch in response to an M-th latch control signal of the M latch control signals;
   the latch control circuit comprises a primary latch control circuit and a secondary latch control circuit;
   the primary latch control circuit is configured to generate L primary latch control signals in response to a latch enable signal, a first control signal, and a second control signal;
   the secondary latch control circuit is configured to generate L secondary latch control signals in response to the first control signal, the second control signal, and the L primary latch control signals; and
   M secondary latch control signals of the L secondary latch control signals are used as the M latch control signals, and L is a positive integer greater than or equal to M.

2. The address latch according to claim 1, wherein the write latch circuit comprises N write latch sub-circuits,
   the N write latch sub-circuits are configured to be sequentially turned on, in response to the N write control signals, respectively, to latch respective data bits of the address data, respectively.

3. The address latch according to claim 2, wherein each of the N write latch sub-circuits comprises a control terminal, an input terminal, and an output terminal,
   the control terminal of each write latch sub-circuit is configured to receive a corresponding write control signal of the N write control signals; and
   the input terminal of each write latch sub-circuit is connected to an address data line to receive the address data.

4. The address latch according to claim 3, wherein the write control circuit comprises N write control sub-circuits, and the N write control sub-circuits are connected to the N write latch sub-circuits in one-to-one correspondence manner,
   the N write control sub-circuits are configured to respectively generate the N write control signals in one-to-one correspondence manner.

5. The address latch according to claim 4, wherein each of the N write control sub-circuits comprises a control terminal, an input terminal, and an output terminal,
   the control terminal of each write control sub-circuit is connected to a write clock signal line to receive a write clock signal,
   the output terminals of the N write control sub-circuits are connected to the control terminals of the N write latch sub-circuits in one-to-one correspondence manner,
   an input terminal of a first write control sub-circuit of the N write control sub-circuits is connected to an output terminal of an N-th write control sub-circuit of the N write control sub-circuits, and an output terminal of an j-th write control sub-circuit of the N write control sub-circuits is connected to an input terminal of an (j+1)-th write control sub-circuit of the N write control sub-circuits, 1<j<N−1, and n is a positive integer.

6. The address latch according to claim 4, wherein the intermediate latch circuit comprises N intermediate latch sub-circuits, the N intermediate latch sub-circuits are connected to the N write latch sub-circuits in one-to-one correspondence manner, and the N intermediate latch sub-circuits are divided into (M−1) intermediate latch sub-circuit groups,
   the (M−1) intermediate latch sub-circuit groups latch the (M−1) data bit groups of the address data latched by the write latch circuit at first to (M−1)-th moments, respectively, in response to the first to (M−1)-th latch control signals, respectively.

7. The address latch according to claim 6, wherein each of the (M−1) intermediate latch sub-circuit groups comprises a plurality of intermediate latch sub-circuits, and the plurality of intermediate latch sub-circuits are adjacent to each other or not adjacent to each other.

8. The address latch according to claim 6, wherein each of the N intermediate latch sub-circuits comprises a control terminal, an input terminal, and an output terminal,
   the input terminals of the N intermediate latch sub-circuits are connected to the output terminals of the N write latch sub-circuits in one-to-one correspondence manner, and the control terminals of each of the (M−1) intermediate latch sub-circuit groups are configured to receive a corresponding latch control signal of the first to (M−1)-th latch control signals.

9. The address latch according to claim 6, wherein the output latch circuit comprises N output latch sub-circuits, the N output latch sub-circuits are connected to the N intermediate latch sub-circuits in one-to-one correspondence manner, the N output latch sub-circuits are configured to output the address data latched by the N intermediate latch sub-circuits from the address latch at an M-th moment in response to the M-th latch control signal.

10. The address latch according to claim 9, wherein each of the N output latch sub-circuits comprises a control terminal, an input terminal, and an output terminal, the input terminals of the N output latch sub-circuits are connected to the output terminals of the N intermediate latch sub-circuits in one-to-one correspondence manner; and the control terminal of each output latch sub-circuit is configured to receive the M-th latch control signal.

11. The address latch according to claim 9, wherein each of the N write control sub-circuits is a D flip-flop, each of the N write latch sub-circuits is a D latch, each of the N intermediate latch sub-circuits is a D latch, and each of the N output latch sub-circuits is a D latch.

12. The address latch according to claim 1, wherein the primary latch control circuit comprises L primary latch control sub-circuits, and each of the L primary latch control sub-circuits comprises a control terminal, an input terminal, and an output terminal, a control terminal of a (2l−1)-th primary latch control sub-circuit of the L primary latch control sub-circuits is connected to a first control signal line to receive the first control signal, and a control terminal of a 2l-th primary latch control sub-circuit of the L primary latch control sub-circuits is connected to a second control signal line to receive the second control signal, an input terminal of a first primary latch control sub-circuit of the L primary latch control sub-circuits is connected to an enable signal line to receive the latch enable signal, an output terminal of a p-th primary latch control sub-circuit of the L primary latch control sub-circuits is connected to an input terminal of a (p+1)-th primary latch control sub-circuit of the L primary latch control sub-circuits, and output terminals of the L primary latch control sub-circuits output the L primary latch control signals, respectively, 1≤l≤L/2, l is a positive integer, 1≤p≤L−1, p is a positive integer, the secondary latch control circuit comprises L secondary latch control sub-circuits, and each of the L secondary latch control sub-circuits comprises a control terminal, an input terminal, and an output terminal, an input terminal of a (2l−1)-th secondary latch control sub-circuit of the L secondary latch control sub-circuits is connected to the second control signal line to receive the second control signal, an input terminal of a 2l-th secondary latch control sub-circuit of the L secondary latch control sub-circuits is connected to the first control signal line to receive the first control signal, the control terminals of the L secondary latch control sub-circuits are connected to the output terminals of the L primary latch control sub-circuits in one-to-one correspondence manner, and the output terminals of the L secondary latch control sub-circuits output the L secondary latch control signals, respectively.

13. The address latch according to claim 12, wherein each of the L primary latch control sub-circuits is a D latch.

14. The address latch according to claim 12, wherein each of the L secondary latch control sub-circuits comprises an NOT gate, a transmission gate, and a transistor, a first terminal of the NOT gate is connected to a first control terminal of the transmission gate, the first terminal of the NOT gate is a control terminal of a corresponding secondary latch control sub-circuit, a second terminal of the NOT gate is connected to a second control terminal of the transmission gate and a gate electrode of the transistor, an input terminal of the transmission gate is an input terminal of the corresponding secondary latch control sub-circuit, an output terminal of the transmission gate is connected to a first electrode of the transistor, the output terminal of the transmission gate is an output terminal of the corresponding secondary latch control sub-circuit, and a second electrode of the transistor is grounded.

15. The address latch according to claim 1, further comprising an address decoding circuit, wherein the address decoding circuit is configured to decode the address data output from the output latch circuit.

16. A display device, comprising a gate driver and an address latch, wherein the address latch comprises a write control circuit, a write latch circuit, a latch control circuit, an intermediate latch circuit, and an output latch circuit, the write control circuit is configured to generate N write control signals, and N is a positive integer greater than or equal to 2;

the write latch circuit is connected to the write control circuit, and is configured to latch an address data that is received in response to the N write control signals, the address data comprises N data bits, and the N data bits are divided into (M−1) data bit groups;

the latch control circuit is configured to sequentially generate M latch control signals, and M is a positive integer greater than or equal to 3;

the intermediate latch circuit is connected to the write latch circuit and the latch control circuit, and is configured to latch, in response to first to (M−1)-th latch control signals of the M latch control signals, the (M−1) data bit groups of the address data latched by the write latch circuit in a time-division manner;

the output latch circuit is connected to the intermediate latch circuit and the latch control circuit, and is configured to output the address data latched by the intermediate latch circuit from the address latch in response to an M-th latch control signal of the M latch control signals;

the latch control circuit comprises a primary latch control circuit and a secondary latch control circuit;

the primary latch control circuit is configured to generate L primary latch control signals in response to a latch enable signal, a first control signal, and a second control signal;

the secondary latch control circuit is configured to generate L secondary latch control signals in response to the first control signal, the second control signal, and the L primary latch control signals;

M secondary latch control signals of the L secondary latch control signals are used as the M latch control signals, and L is a positive integer greater than or equal to M; and the gate driver is configured to generate a scan signal corresponding to the address data in response to the address data output from the address latch.

17. An address latching method for an address latch, wherein the address latch comprises a write control circuit, a write latch circuit, a latch control circuit, an intermediate latch circuit, and an output latch circuit, the write control circuit is configured to generate N write control signals, and N is a positive integer greater than or equal to 2; the write latch circuit is connected to the write control circuit, and is configured to latch an address data that is received in response to the N write control signals, the address data comprises N data bits, and the N data bits are divided into (M−1) data bit groups; the latch control circuit is configured to sequentially generate M latch control signals, and M is a positive integer greater than or equal to 3; the intermediate latch circuit is connected to the write latch circuit and the latch control circuit, and is configured to latch, in response to first to (M−1)-th latch control signals of the M latch control signals, the (M−1) data bit groups of the address data latched by the write latch circuit in a time-division manner; and the output latch circuit is connected to the intermediate latch circuit and the latch control circuit, and is configured to output the address data latched by the intermediate latch circuit from the address latch in response to an M-th latch control signal of the M latch control signals, wherein the latch control circuit comprises a primary latch control circuit and a secondary latch control circuit, the primary latch control circuit is configured to generate L primary latch control signals in response to a latch enable signal, a first control signal, and a second control signal, the secondary latch control circuit is configured to generate L secondary latch control signals in response to the first control signal, the second control signal, and the L primary latch control signals, and M secondary latch control signals of the L secondary latch control signals are use as the M latch control signals, and L is a positive integer greater than or equal to M, the address latching method comprises:

in a write latch phase, latching, by the write latch circuit, the address data in response to the N write control signals generated by the write control circuit;

in an intermediate latch phase, latching, by the intermediate latch circuit, the (M−1) data bit groups of the address data latched by the write latch circuit in a time-division manner in response to the first to (M−1)-th latch control signals generated by the latch control circuit; and in an output latch phase, outputting, by the output latch circuit, the address data latched by the intermediate latch circuit from the address latch in response to the M-th latch control signal generated by the latch control circuit.

18. The address latching method according to claim 17, wherein before the write latch circuit has latched all data bits of the address data, the intermediate latch circuit starts to latch a part of data bits, which has been latched by the write latch circuit, of the address data.

19. The address latching method according to claim 17, wherein the address latch further comprises an address decoding circuit, and the address latching method further comprises:

in an address decoding phase, decoding, by the address decoding circuit, the address data output from the output latch circuit.

* * * * *